(12) United States Patent
Jang et al.

(10) Patent No.: US 12,106,806 B2
(45) Date of Patent: Oct. 1, 2024

(54) MEMORY DEVICE STORING LOGICAL PAGE DATA AND OPERATING METHOD OF THE MEMORY DEVICE

(71) Applicant: SK hynix Inc., Icheon-si (KR)

(72) Inventors: Jung Shik Jang, Icheon-si (KR); In Su Park, Icheon-si (KR); Woo Pyo Jeong, Icheon-si (KR); Jung Dal Choi, Icheon-si (KR); Jae Woong Kim, Icheon-si (KR); Jeong Hwan Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 48 days.

(21) Appl. No.: 17/746,375

(22) Filed: May 17, 2022

(65) Prior Publication Data

US 2023/0186989 A1 Jun. 15, 2023

(30) Foreign Application Priority Data

Dec. 13, 2021 (KR) .......................... 10-2021-0177893

(51) Int. Cl.
| | |
|---|---|
| G11C 16/04 | (2006.01) |
| G11C 16/08 | (2006.01) |
| G11C 16/10 | (2006.01) |
| G11C 16/24 | (2006.01) |
| G11C 16/26 | (2006.01) |

(52) U.S. Cl.
CPC .......... *G11C 16/0433* (2013.01); *G11C 16/08* (2013.01); *G11C 16/102* (2013.01); *G11C 16/24* (2013.01); *G11C 16/26* (2013.01)

(58) Field of Classification Search
CPC ................................................ G11C 16/0483
USPC ........................................ 365/185.05, 185.17
See application file for complete search history.

(56) References Cited

U.S. PATENT DOCUMENTS

| | | | | |
|---|---|---|---|---|
| 10,566,348 | B1* | 2/2020 | Yeh ........................ | H10B 43/27 |
| 2017/0062456 | A1 | 3/2017 | Sugino et al. | |
| 2018/0293007 | A1* | 10/2018 | Jeong ...................... | G06F 3/064 |
| 2019/0148505 | A1* | 5/2019 | Eom .................. | H01L 29/42344 |
| | | | | 257/324 |
| 2023/0131500 | A1* | 4/2023 | Yang ................... | G11C 11/4085 |
| | | | | 365/189.011 |

FOREIGN PATENT DOCUMENTS

KR 1020210010210 A 1/2021

* cited by examiner

*Primary Examiner* — Hoai V Ho
(74) *Attorney, Agent, or Firm* — WILLIAM PARK & ASSOCIATES LTD.

(57) ABSTRACT

The present discloses provides a memory device and a method of operating the memory device. The memory device includes first main plugs formed in a vertical direction over a substrate and arranged in a first direction, second main plugs, third main plugs arranged between the first and second main plugs, the third main plugs adjacent to the first and second main plugs, and bit lines above the first to third main plugs, wherein each of the first to third main plugs includes first and second sub-plugs facing each other, wherein portions of the first and second sub-plugs included in each of the first and third main plugs are coupled to different select lines, and wherein portions of the first and second sub-plugs included in each of the second and third main plugs are coupled to different select lines.

10 Claims, 23 Drawing Sheets

MEMORY DEVICE STORING LOGICAL PAGE DATA AND OPERATING METHOD OF THE MEMORY DEVICE

CROSS-REFERENCE TO RELATED APPLICATION

The present application claims priority under 35 U.S.C. § 119(a) to Korean patent application number 10-2021-0177893 filed on Dec. 13, 2021, in the Korean Intellectual Property Office, the entire disclosure of which is incorporated by reference herein.

BACKGROUND

1. Technical Field

Various embodiments relate generally to a memory device, and more particularly, to a three-dimensional memory device and an operating method of the memory device.

2. Related Art

Memory devices may be classified into a volatile memory device losing the stored data when power supply is blocked and a non-volatile memory device retaining the stored data even when power supply is blocked.

A non-volatile memory device may include NAND flash memory, NOR flash memory, resistive random access memory (ReRAM), phase-change random access memory (PRAM), magnetoresistive random access memory (MRAM), ferroelectric random access memory (FRAM), and spin transfer torque random access memory (STT-RAM).

Memory cells included in NAND flash memory, among these memories, may be coupled between word lines and bit lines, and may be programmed or read by voltages applied to the word lines and the bit lines.

SUMMARY

According to an embodiment, a memory device may include first main plugs formed in a vertical direction over a substrate and arranged in a first direction, second main plugs arranged substantially in parallel with the first main plugs, third main plugs arranged in the first direction between the first and second main plugs, the third main plugs adjacent to the first and second main plugs in a diagonal direction, and bit lines spaced apart from each other above the first to third main plugs, wherein each of the first to third main plugs includes first and second sub-plugs facing each other in a second direction substantially orthogonal to the first direction, wherein portions of the first and second sub-plugs included in each of the first and third main plugs are coupled to different select lines, and wherein portions of the first and second sub-plugs included in each of the second and third main plugs are coupled to different select lines.

According to an embodiment, a method of operating a memory device may include dividing M bits of page data into first and second data groups each including M/2 bits of the page data, where M is a positive integer, programming the first data group into first memory cells coupled to a selected word line, and programming the second data group into second memory cells coupled to the selected word line.

According to an embodiment, a method of operating a memory device may include dividing M bits of page data into first and second data groups, wherein M is a positive integer, dividing logical page data included in the first data group into first and second logical page data groups, dividing logical page data included in the second data group into third and fourth logical page data groups, programming the first logical page data group into first memory cells selected by a first select line, programming the second logical page data group into second memory cells selected by a second select line forming a pair with the first select line, programming the third logical page data group into third memory cells selected by a third select line, and programming the fourth logical page data group into fourth memory cells selected by a fourth select line forming a pair with the third select line.

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers, plugs, lines, and/or sections etc., these elements, components, regions, layers, plugs, lines, and/or sections etc., should not be limited by these terms. These terms are only used to distinguish one element, component, region, layer, plug, line, or section etc., from another region, layer, plug, line, or section etc. Thus, a first element, component, region, layer, plug, line, or section etc., discussed below could be termed a second element, component, region, layer, plug, line, or section etc., without departing from the teachings of the present disclosure.

Various embodiments are directed to a memory device capable of improving a degree of integration.

Various embodiments are directed to a method of operating a memory device with an improved operating speed.

Figure 1:
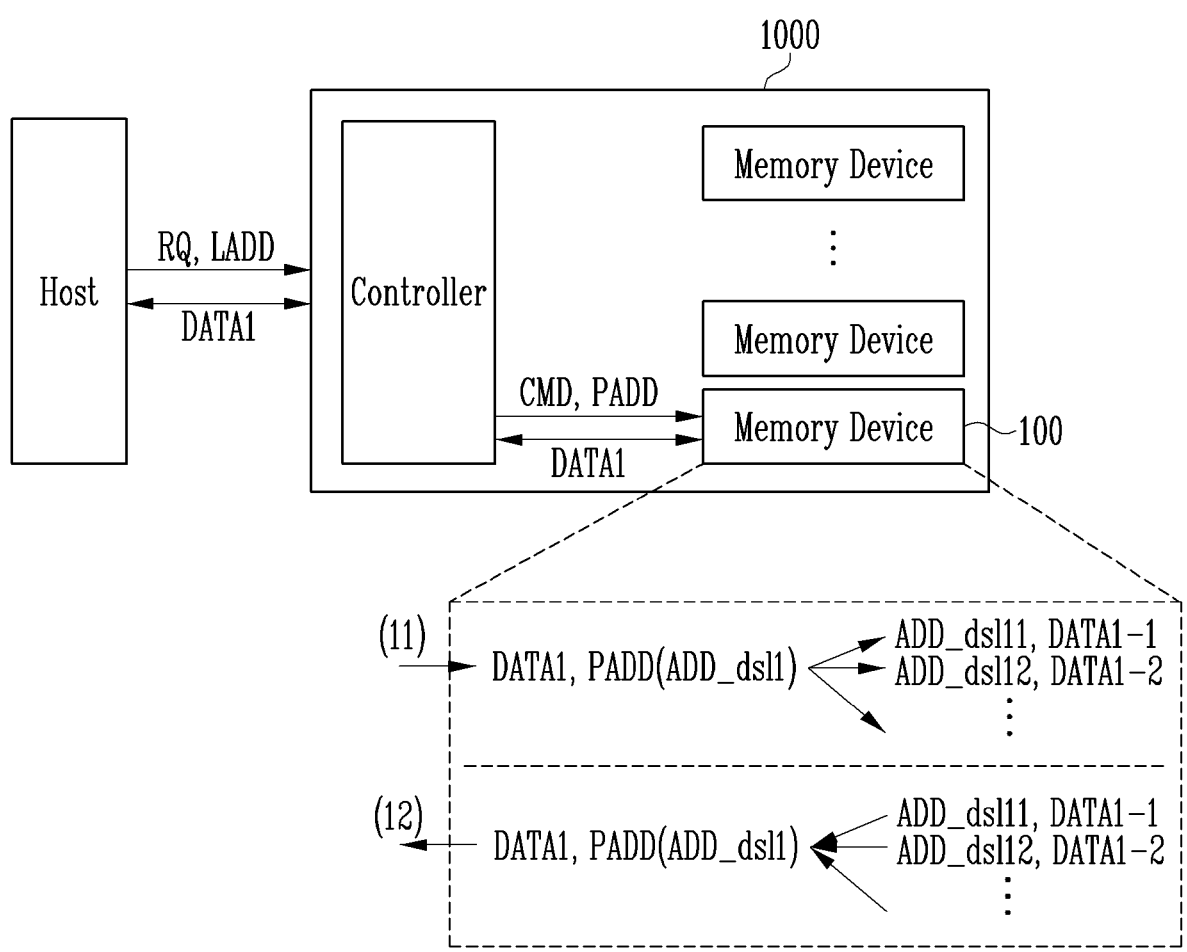
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a plurality of memory devices and a controller.

The controller may control the plurality of memory devices to store data, or output or erase the stored data. The plurality of memory devices may include a volatile memory device and a non-volatile memory device. A description will be made below based on a non-volatile memory device as an example. However, this embodiment is applicable to a volatile memory device.

The controller may be configured to control memory devices in response to a request RQ of a host, or manage the plurality of memory devices by a background operation without the request RQ of the host. The controller may be configured to output a command CMD for controlling the memory devices in response to the request RQ of the host. For example, when the request RQ which is output from the host is a program request, the controller may output a program command. For example, when the request RQ which is output from the host is a read request, the controller may output a read command. The memory devices may perform a program, read, or erase operation in response to the command CMD output from the controller.

The host may transfer the request RQ for program, a logical address LADD, and first data DATA1 to the controller during a program operation, and may transfer the request RQ for read or erase and the logical address LADD to the controller during a read or erase operation. During the read operation, when the first data DATA1 is output from the memory system 1000, the host may receive the first data DATA1.

When the controller receives the logical address LADD output from the host, the controller may select a physical address PADD which is mapped to the received logical address LADD, and may transfer the first data DATA1, which is output from the host, to a selected memory device according to the physical address PADD.

Operations which are performed on a memory device 100 which is one of the plurality of memory devices will be described as below.

During a program operation (11), the memory device 100 may be configured to program at least one selected memory block with the first data DATA1 according to the command CMD and the physical address PADD transferred from the controller. The physical address PADD may include various addresses for programming the first data DATA1. For example, examples of the physical address PADD may include a memory device address, a plane address, a memory block address, a page address, a drain select line address, and the like. According to an embodiment of the present disclosure, the memory device 100 may separate a first drain select line address ADD_dsl1 included in the physical address PADD into a plurality of drain select line addresses ADD_dsl11, ADD_dsl12, . . . , and may separate the first data DATA1 into a plurality of data groups DATA1-1, DATA1-2, . . . according to the number of drain select line addresses ADD_dsl11, ADD_dsl12, In the memory device 100 according to an embodiment of the present disclosure, one drain select line may be separated into a plurality of drain select lines, and a plurality of sub-plugs may be coupled to the separated drain select lines, respectively. The plurality of data groups DATA1-1, DATA1-2, . . . may be programmed into memory cells of the sub-plugs coupled to the separated drain select lines, respectively. According to an embodiment of the present disclosure, the memory device 100 may include a mapping table for a plurality of drain select line addresses mapped to a drain select line address received from an external device. page address, a drain select line address, and the like. According to an embodiment of the present disclosure, the memory device 100 may separate a first drain select line address ADD_dsl1 included in the physical address PADD into a plurality of drain select line addresses ADD_dsl1-1, ADD_dsl1-2, . . . , and may separate the first data DATA1 into a plurality of data groups DATA1-1, DATA1-2, . . . according to the number of drain select line addresses ADD_dsl1-1, ADD_dsl1-2, . . . . In the memory device 100 according to an embodiment of the present disclosure, one drain select line may be separated into a plurality of drain select lines, and a plurality of sub-plugs may be coupled to the separated drain select lines, respectively. The plurality of data groups DATA1-1, DATA1-2, . . . may be programmed into memory cells of the sub-plugs coupled to the separated drain select lines, respectively. According to an embodiment of the present disclosure, the memory device 100 may include a mapping table for a plurality of drain select line addresses mapped to a drain select line address received from an external device.

Contrary to the program operation (11), during a read operation (12), the memory device 100 may incorporate data read from the sub-plugs coupled to the plurality of drain select line addresses ADD_dsl1-1, ADD_dsl1-2, . . . , respectively, into the first data DATA1, and may output the first data DATA1 as data corresponding to the first drain select line address ADD_dsl1.

Figure 2:
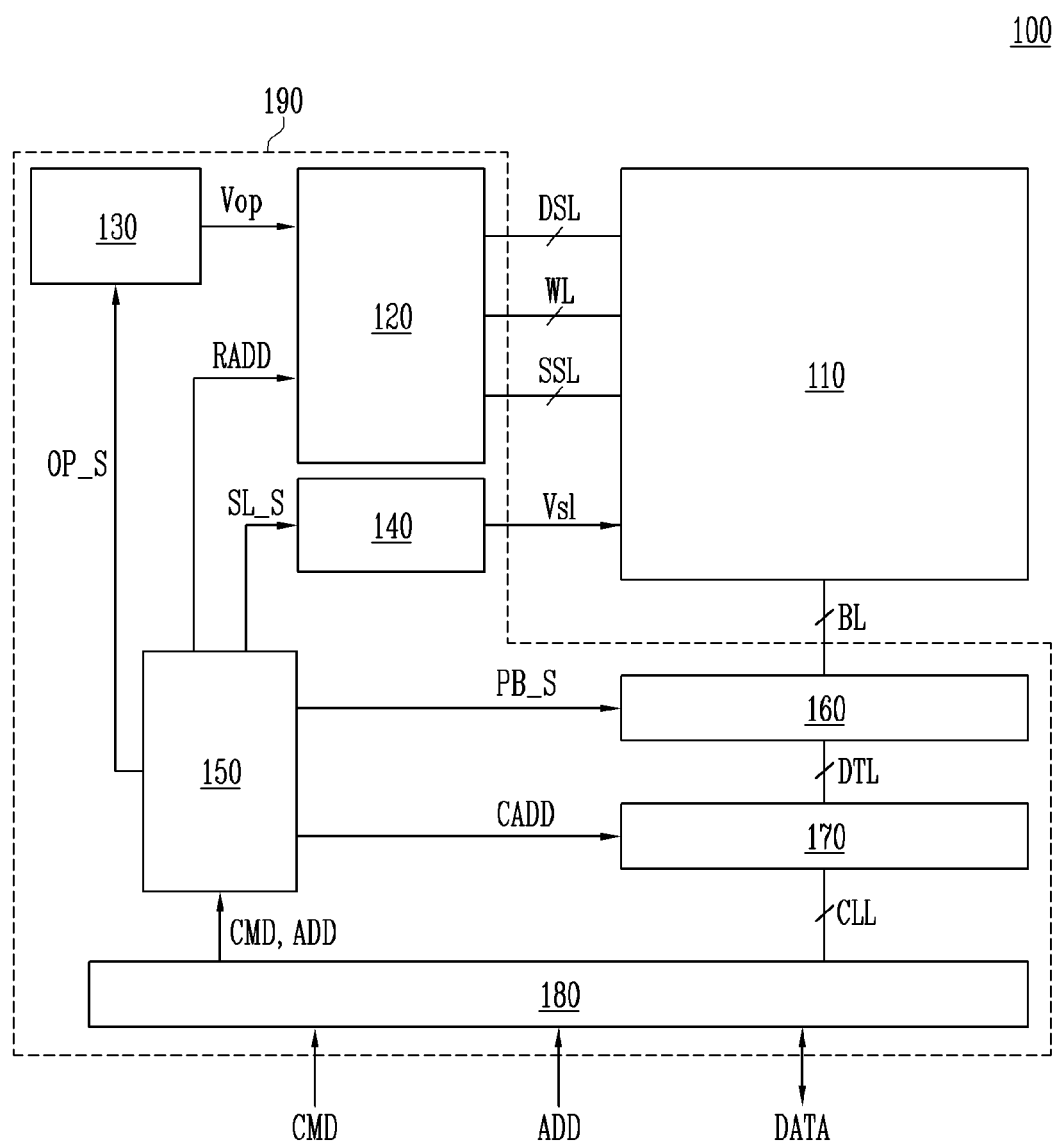
FIG. 2 is a diagram illustrating a memory device according to an embodiment of the present disclosure.

FIG. 2 is a diagram illustrating the memory device 100 according to an embodiment of the present disclosure.

Referring to FIG. 2, the memory device 100 may include a peripheral circuit 190 and a memory cell array 110.

The peripheral circuit 190 may perform a program operation and a verify operation for storing data in the memory cell array 110, a read operation for outputting the data stored in the memory cell array 110, and an erase operation for erasing the data stored in the memory cell array 110. The peripheral circuit 190 may include a voltage generator 130, a row decoder 120, a source line driver 140, a control circuit 150, a page buffer 160, a column decoder 170, and an input/output circuit 180.

The memory cell array 110 may include a plurality of memory cells that store data. According to an embodiment, the memory cell array 110 may include a three-dimensional memory cell array. The plurality of memory cells may store single bit data, or multi bit data of two or more bits according to a program scheme. The plurality of memory cells may form a plurality of strings. Memory cells which are included in each of the strings may be electrically coupled to each other through channels. The channels included in the strings may be coupled to the page buffer 160 through bit lines BL.

The voltage generator 130 may generate various operating voltages Vop for a program operation, a read operation, or an erase operation in response to an operation signal OP_S. For example, the voltage generator 130 may selectively generate and output various operating voltages Vop that include a program voltage, a verify voltage, a pass voltage, a read voltage, and an erase voltage.

The row decoder 120 may be coupled to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD.

The source line driver 140 may transfer a source voltage Vsl to the memory cell array 110 in response to a source line signal SL_S. For example, the source voltage Vsl may be transferred to a source line coupled to the memory cell array 110.

The control circuit 150 may output the operation signal OP_S, the row address RADD, a source line signal SL_S, a page buffer control signal PB_S, and a column address CADD in response to the command CMD and an address ADD.

The page buffer 160 may be coupled to the memory cell array 110 through the bit lines BL. The page buffer 160 may temporarily store data DATA received through the plurality of bit lines BL in response to the page buffer control signal PB_S. The page buffer 160 may sense voltages or currents in the plurality of bit lines BL during a read operation.

The column decoder 170 may transfer the data DATA, which is input from the input/output circuit 180, to the page buffer 160, or may transfer the data DATA stored in the page buffer 160 to the input/output circuit 180 in response to the column address CADD. The column decoder 170 may exchange the data DATA with the input/output circuit 180 through column lines CLL and the data DATA with the page buffer 160 through data lines DTL.

The input/output circuit 180 may transfer the command CMD and the address ADD, which are transferred from the external device (e.g., a controller) coupled to the memory device 100 to the control circuit 150, and may output the data received from the column decoder 170 to the external device.

Figure 3:
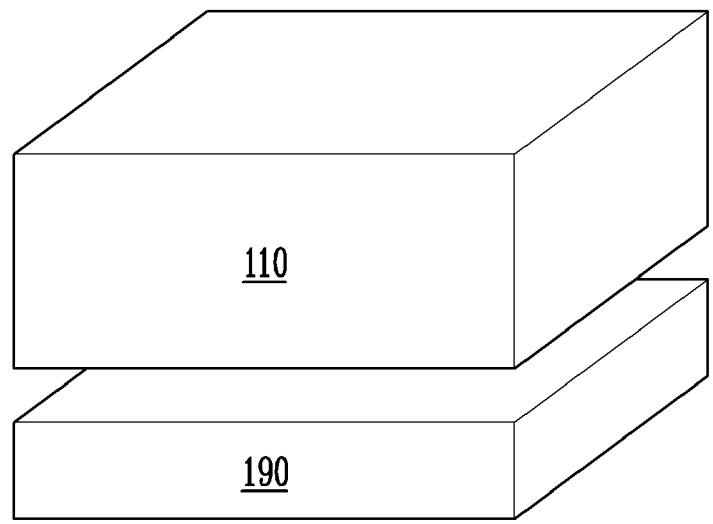
FIG. 3 is a diagram illustrating the arrangement of a memory cell array and a peripheral circuit.

FIG. 3 is a diagram illustrating the arrangement of the memory cell array 110 and the peripheral circuit 190.

Referring to FIG. 3, the memory cell array 110 may be stacked on top of the peripheral circuit 190. For example, when a substrate is formed in an X-Y plane, the peripheral circuit 190 may be stacked in a Z direction from a substrate, and the memory cell array 110 may be stacked over the peripheral circuit 190. In an embodiment, the X direction may be substantially orthogonal to the Y direction as shown in FIG. 3.

Figure 4:
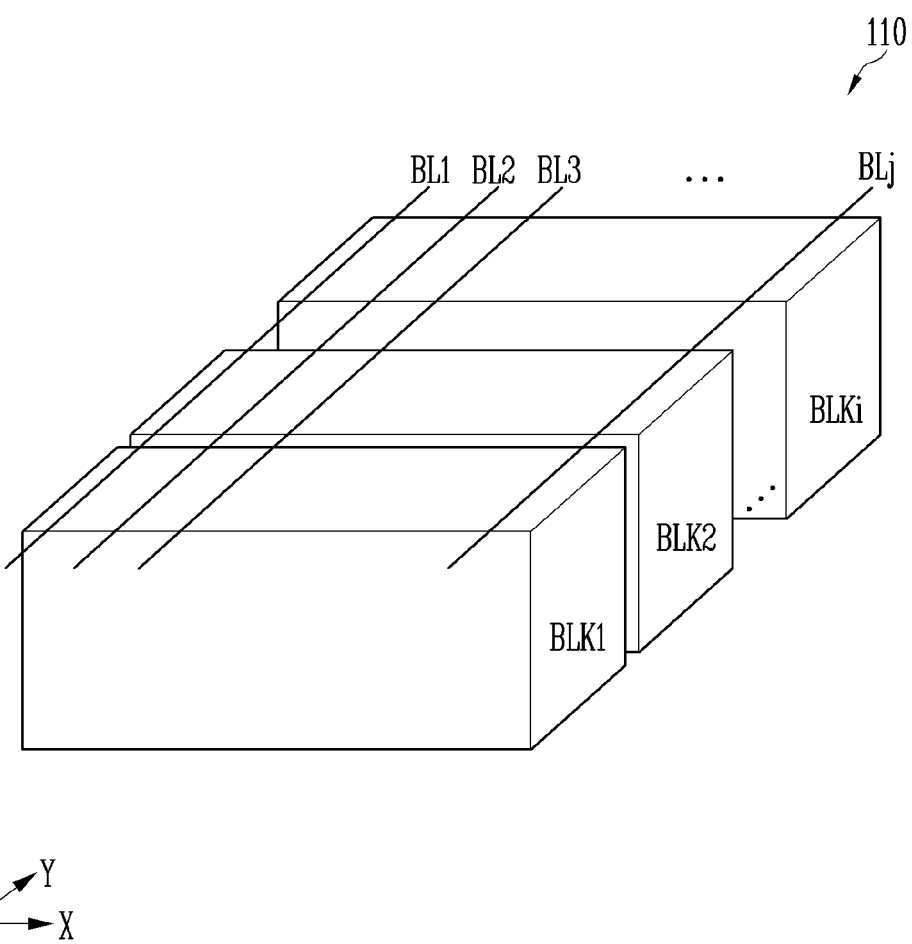
FIG. 4 is a diagram illustrating the structure of a memory cell array.

FIG. 4 is a diagram illustrating the structure of the memory cell array 110.

Referring to FIG. 4, the memory cell array 110 may include first to ith memory blocks BLK1 to BLKi, where i is a positive integer. The first to ith memory blocks BLK1 to BLKi may be arranged and spaced apart from each other in a Y direction and coupled in common to first to jth bit lines BL1 to BLj. For example, the first to jth bit lines BL1 to BLj may extend in the Y direction and spaced apart from each other in the X direction. The first to ith memory blocks BLK1 to BLKi may include a plurality of main plugs (not shown) which extend in the Z direction. The main plugs may include a plurality of memory cells which store data. The structure of a memory block which includes a plurality of main plugs will be described below.

Figure 5:
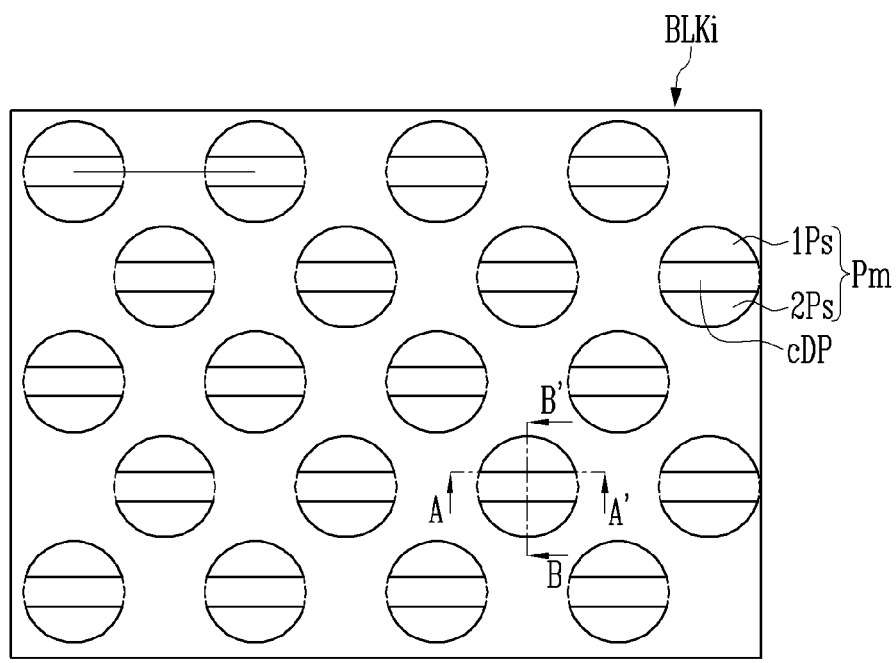
FIG. 5 is a diagram illustrating the structure of a memory block.
Figure 5:
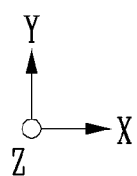

FIG. 5 is a plan view illustrating the structure of a memory block.

Referring to FIG. 5, a memory block may include a plurality of main plugs Pm. The main plugs Pm may be spaced apart from each other in the X and Y directions and have a cylindrical shape extending in the Z direction. Each of the main plugs Pm may include first and second sub-plugs 1Ps and 2Ps which are spaced apart from each other in the Y direction. The first and second sub-plugs 1Ps and 2Ps may be separated from each other by a channel isolation pattern cDP. Therefore, the memory cells included in the main plug Pm may be separated into memory cells included in the first sub-plug 1Ps and memory cells included in the second sub-plug 2Ps. In other words, the memory cells included in the first sub-plug 1Ps and the memory cells included in the second sub-plug 2Ps may store data independently of each other. The first and second sub-plugs 1Ps and 2Ps as shown in FIG. 5 are described below with reference to FIG. 6. In an embodiment, the Z direction may be a vertical direction. For example, main plugs Pm may be formed in the vertical direction over a substrate. In an embodiment, main plugs Pm may be formed over a substrate and the substrate may include a source line SL. In an embodiment, the X direction may be a first direction, the Y direction may be a second direction, and the main plugs Pm may be arranged in the first direction and second direction.

Figure 6:
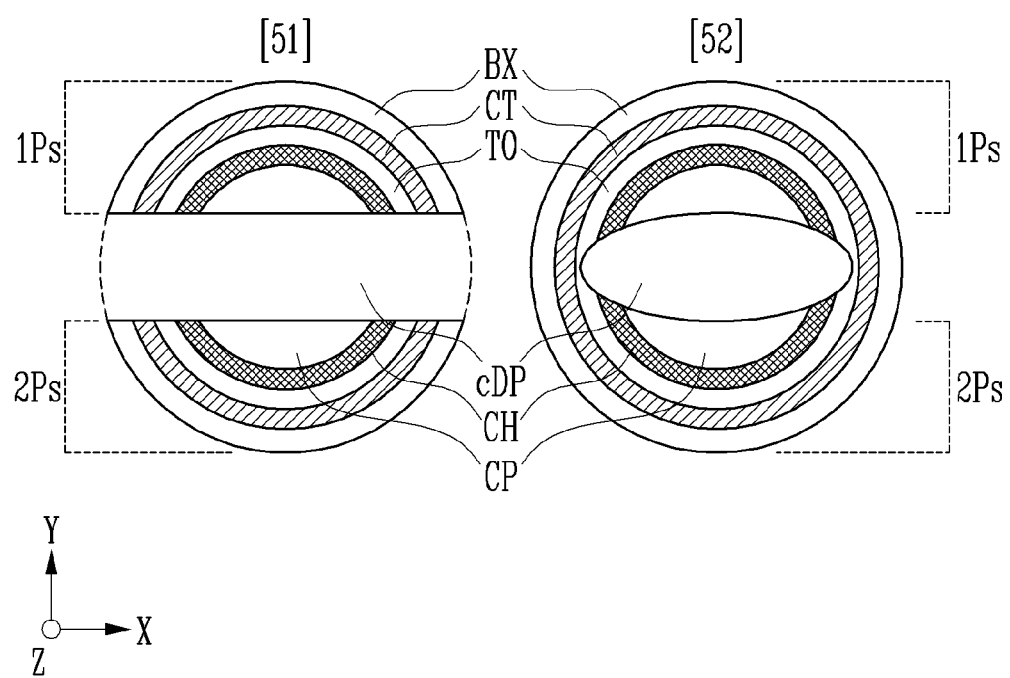
FIG. 6 is a plan view illustrating the structure of sub-plugs.

FIG. 6 is a plan view illustrating the structure of the first and second sub-plugs 1Ps and 2Ps.

Referring to FIG. 6, the first sub-plug 1Ps and the second sub-plug 2Ps may include a core pillar CP, a channel layer CH, a tunnel isolation layer TO, a charge trap layer CT, and a blocking layer BX which have a symmetrical structure with respect to the channel isolation pattern cDP. The core pillar CP may be formed at the center of the first and second sub-plugs 1Ps and 2Ps which face each other, and may include an insulating material. The channel layer CH may refer to a layer in which electrons or holes are moved. The channel layer CH may have a cylindrical shape surrounding the core pillar CP and include a silicon layer, a doped silicon layer, or a polysilicon layer. The tunnel isolation layer TO may be provided to prevent or mitigate movements of the electrons between the channel layer CH and the charge trap layer CT. The tunnel isolation layer TO may have a cylindrical shape surrounding the channel layer CH and include an insulating material. For example, the tunnel isolation layer TO may include an oxide layer or a silicon oxide layer. The charge trap layer CT may be provided to trap electrons. The charge trap layer CT may have a cylindrical shape surrounding the tunnel isolation layer TO and include a nitride layer. The blocking layer BX may electrically insulate the charge trap layer CT from a gate line (not shown). The blocking layer BX may have a cylindrical shape surrounding the charge trap layer CT and include an insulating material. For example, the blocking layer BX may include an oxide layer or a silicon oxide layer.

The first and second sub-plugs 1Ps and 2Ps may have various shapes depending on the shape of the channel isolation pattern cDP. For example, the core pillar CP, the channel layer CH, the tunnel isolation layer TO, the charge trap layer CT, and the blocking layer BX may be separated by the channel isolation pattern cDP to thereby form the first and second sub-plugs 1Ps and 2Ps (51). Alternatively, only the core pillar CP and the channel layer CH may be separated while the tunnel isolation layer TO, the charge trap layer CT, and the blocking layer BX form the first and second sub-plugs 1Ps and 2Ps which are coupled to each other. In other words, the first and second sub-plugs 1Ps and 2Ps may be defined by the structure where the channel layer CH is separated. For example, in addition to the structure shown in FIG. 6, the first and second sub-plugs 1Ps and 2Ps may include the core pillar CP and the channel layer CH which are separated by the channel isolation pattern cDP, or may include the core pillar CP, the channel layer CH, the tunnel insolation layer TO, and the charge trap layer CT which are separated by the channel isolation pattern cDP. In addition, although FIG. 6 illustrates that the channel isolation pattern cDP extends in the X direction, the channel isolation pattern cDP may extend in the Y direction, or in any direction between the X direction and the Y direction. The memory cells included in the first and second sub-plugs 1Ps and 2Ps which include the channel layer CH separated by the channel isolation pattern cDP may store data independently of each other.

Figure 7:
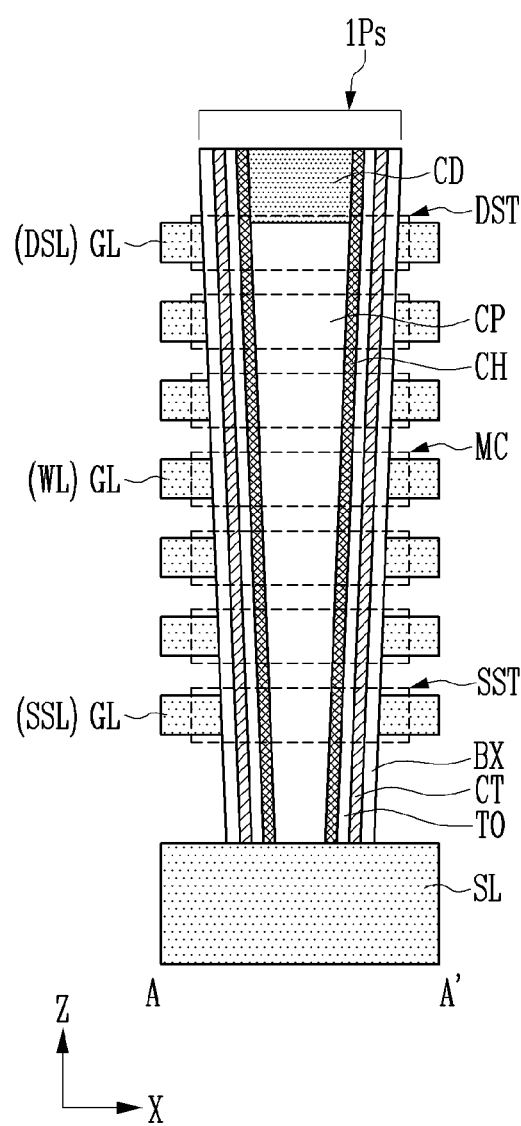
FIG. 7 is a cross-sectional diagram illustrating the structure of a sub-plug taken along line A-A' of FIG. 5.

FIG. 7 is a cross-sectional diagram illustrating the structure of the sub-plug taken along line A-A' of FIG. 5.

Referring to FIG. 7, a plurality of gate lines GL may be stacked and spaced apart from each other, and the first sub-plug 1Ps may vertically pass through the plurality of gate lines GL. The plurality of gate lines GL may include a source select line SSL, the word lines WL, and a drain select line DSL. The source select line SSL may be coupled to a gate of a source select transistor SST. The word lines WL may be coupled to gates of memory cells MC. The drain select line DSL may be coupled to a gate of a drain select transistor DST. The source select transistor SST may electrically block or couple a source line SL and the memory cells MC. The drain select transistor DST may electrically block or couple the bit line BL and the memory cells MC. The source line SL may contact a lower portion of the channel layer CH and the bit line BL may contact an upper portion of the channel layer CH. Depending on the configuration of the memory device, however, the bit line BL may be arranged under the channel layer CH, and the source line SL may be arranged on top of the channel layer CH. A conductive layer CD for improving the electrical characteristics of the drain select transistor DST may be formed on top of the core pillar CP.

Though not shown in FIG. 7, the gate lines GL may further include dummy lines. The dummy lines may be coupled to gates of dummy cells. The dummy cells might not store substantial data and may be used to prevent or mitigate electrical characteristic deterioration of memory cells or transistors. The dummy lines may be arranged between the source select line SSL and the word lines WL, between the word lines WL and the drain select line DSL, and between the word lines WL.

Figure 8:
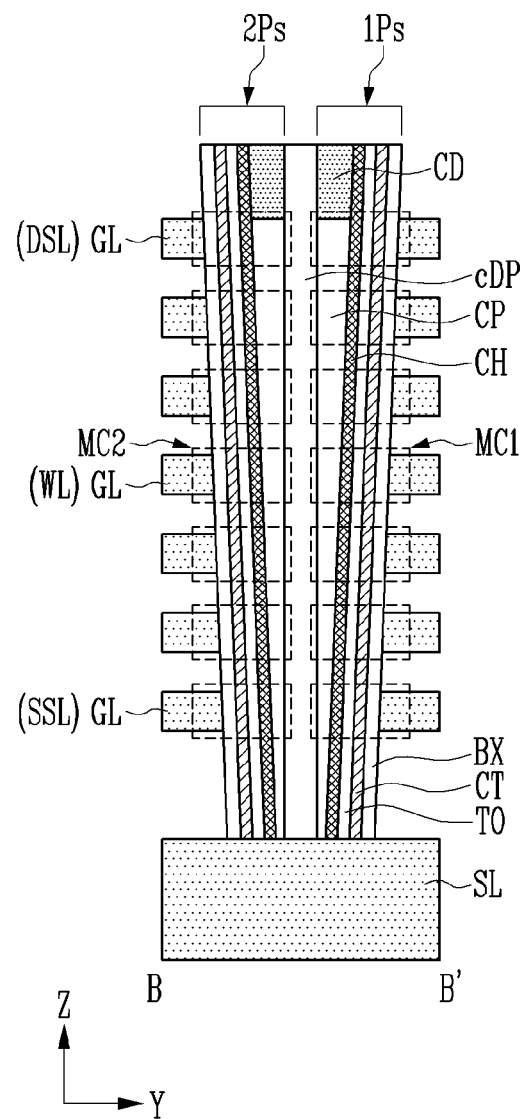
FIG. 8 is a cross-sectional diagram illustrating the structure of sub-plugs taken along line B-B' of FIG. 5.

FIG. 8 is a cross-sectional diagram illustrating the structure of sub-plugs taken along line B-B' of FIG. 5.

Referring to FIG. 8, the channel isolation pattern cDP may be formed between the first and second sub-plugs 1Ps and 2Ps. The channel isolation pattern cDP may separate the channel layer CH included in the first and second sub-plugs 1Ps and 2Ps and may vertically separate the first and second sub-plugs 1Ps and 2Ps. The channel isolation pattern cDP may vertically separate the channel layer CH and might not separate the gate lines GL. Memory cells coupled to the same word line WL may be separated by the channel isolation pattern cDP. For example, memory cells coupled to the same word line WL may be separated into first memory cells MC1 included in the first sub-plug 1Ps and second memory cells MC2 included in the second sub-plug 2Ps by the channel isolation pattern cDP.

Figure 9:
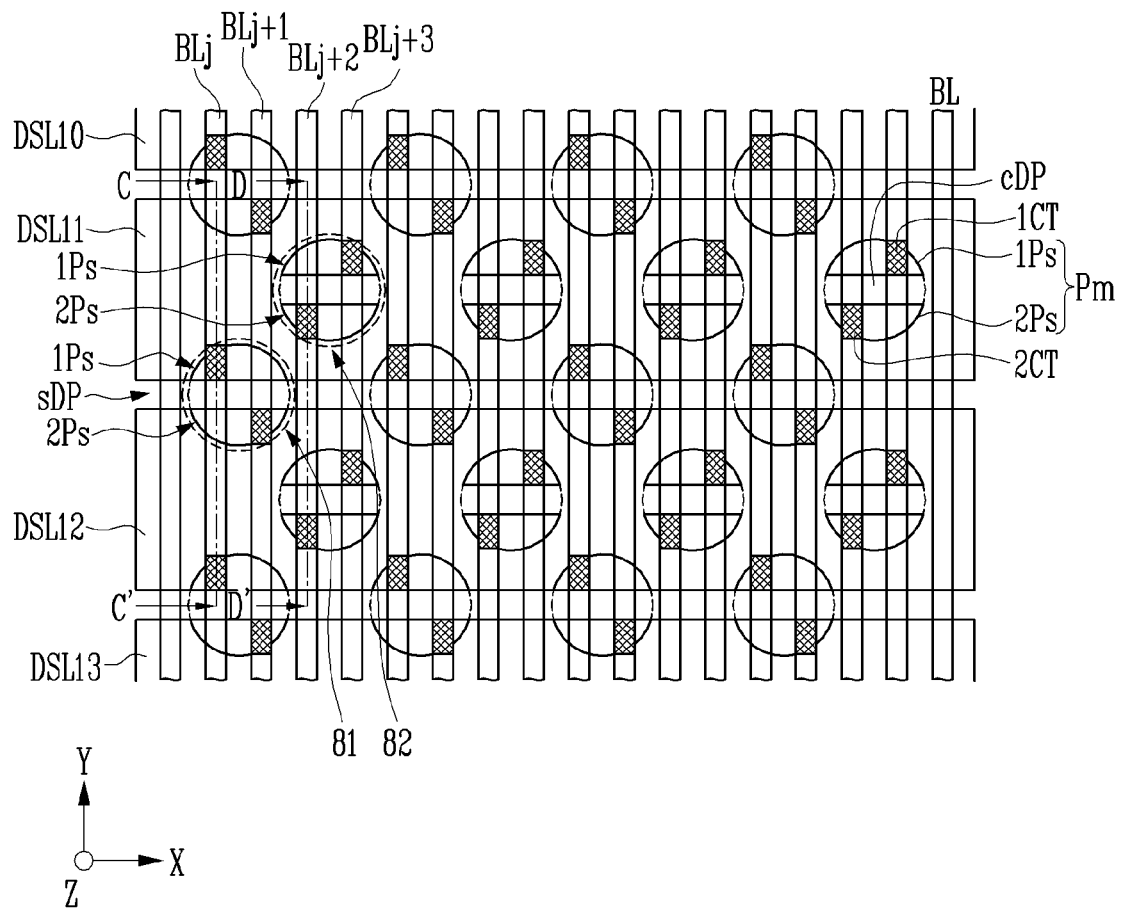
FIG. 9 is a plan view illustrating the structure of a memory block according to a first embodiment of the present disclosure.

FIG. 9 is a plan view illustrating the structure of a memory block according to a first embodiment of the present disclosure.

Referring to FIG. 9, the first sub-plugs 1Ps may be electrically coupled to the bit lines BL through first contacts 1CT, and the second sub-plugs 2Ps may be electrically coupled to the bit lines BL through second contacts 2CT. The first and second sub-plugs 1Ps and 2Ps included in the same main plug Pm may be coupled to different bit lines BL through the first or second contact 1CT or 2CT. For example, the first sub-plugs 1Ps which are arranged in the Y direction may be coupled to jth bit lines BLj through the first contacts 1CT, and the second sub-plugs 2Ps which are arranged in the Y direction may be coupled to (j+1)th bit lines BLj+1 through the second contacts 2CT.

To increase the distance between contacts coupled to adjacent main plugs in a diagonal direction, the contacts coupled to the main plugs which are adjacent to each other in the diagonal direction may be arranged in opposite directions. For example, on the basis of a main plug (81) which includes the first sub-plug 1Ps coupled to the jth bit line BLj through the first contact 1CT and the second sub-plug 2Ps coupled to the (j+1)th bit line BLj+1 through the second contact 2CT, the second sub-plug 2Ps may be coupled to a (j+2)th bit line BLj+2 through the second contact 2CT and the first sub-plug 1Ps may be coupled to a (j+3)th bit line BLj+3 through the first contact 1CT in a main plug (82) adjacent to the main plug (81) in the diagonal direction.

A drain select line may be separated in the Y direction and extend in the X direction. For example, 10th, 11th, 12th, and 13th drain select lines DSL10, DSL11, DSL12, and DSL13 may be separated by a selected isolation pattern sDP which extends in the X direction. In some main plugs Pm, the first and second sub-plugs 1Ps and 2Ps may be coupled to different drain select lines. In other main plugs Pm, the first and second sub-plugs 1Ps and 2Ps may be coupled to the same drain select line.

For example, the first and second sub-plugs 1Ps and 2Ps included in the main plugs Pm arranged in the X direction may be coupled to the same drain select line, and the first and second sub-plugs 1Ps and 2Ps of the main plugs Pm adjacent to the corresponding main plugs Pm in the diagonal direction may be coupled to different drain select lines.

The structure shown in FIG. 9 is described as below.

Figure 10:
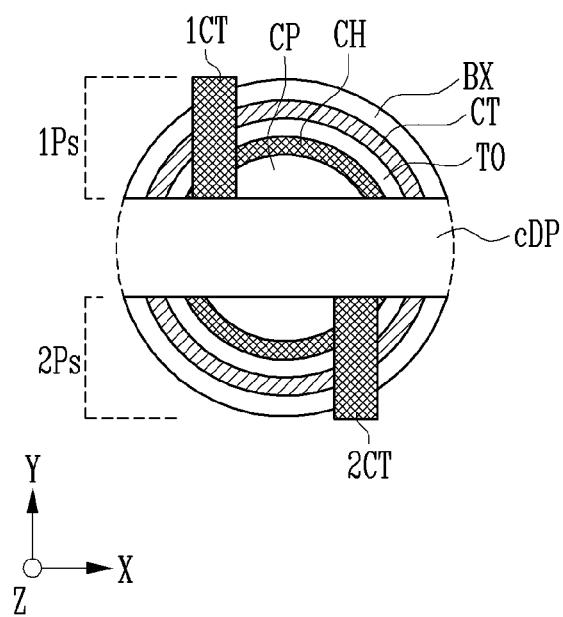
FIG. 10 is a plan view illustrating the structure of sub-plugs shown in FIG. 9.

FIG. 10 is a plan view illustrating the structure of sub-plugs shown in FIG. 9.

Referring to FIG. 10, the first contact 1CT may contact the channel layer CH included in the first sub-plug 1Ps, and the second contact 2CT may contact the channel layer CH included in the second sub-plug 2Ps. In the structure as shown in FIG. 10, the first contact 1CT may be arranged closer to the left side than the second contact 2CT. However, when plugs are adjacent to each other in the diagonal direction, the first contact 1CT may be arranged closer to the right side than the second contact 2CT.

Figure 11A:
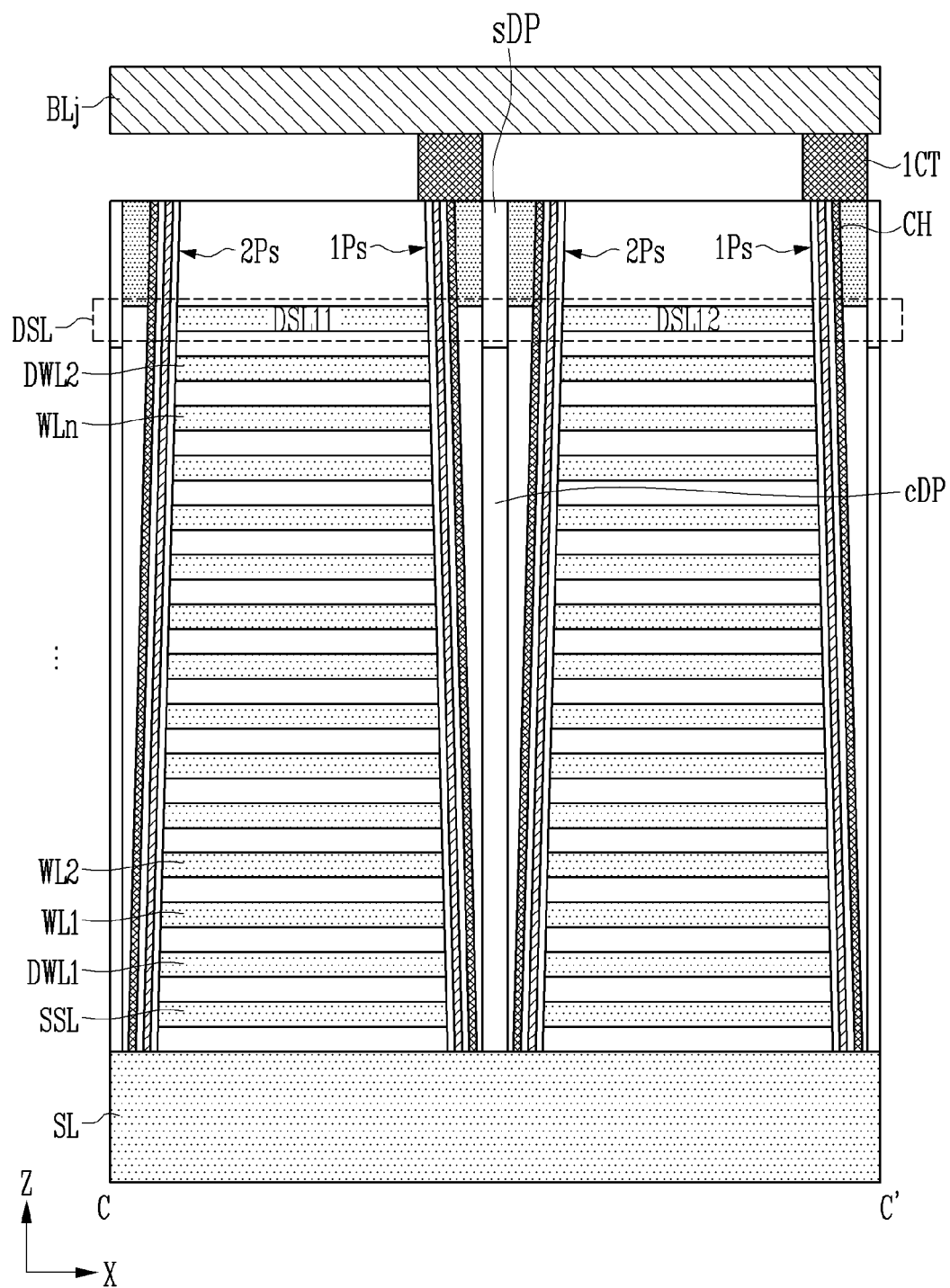
FIG. 11A is a cross-sectional diagram illustrating the structure of a memory block taken along line C-C' of FIG. 9.

FIG. 11A is a cross-sectional diagram illustrating the structure of a memory block taken along line C-C' of FIG. 9.

Referring to FIG. 11A, the source select line SSL, a first dummy line DWL1, first to nth word lines WL1 to WLn, a second dummy line DWL2, and the drain select line DSL may be stacked and spaced apart from each other over the source line SL. Lines which are formed on the same layer, among the source select line SSL, the first dummy line DWL1, the first to nth word lines WL1 to WLn, and the second dummy line DWL2, may be coupled to each other. On the other hand, even when the drain select line DSL is on the same layer, the drain select line DSL may be separated into a plurality of drain select lines by the selected isolation pattern sDP. For example, the drain select line DSL may be separated into the 11th and 12th drain select lines DSL11 and DSL12 by the selected isolation pattern sDP.

The first and second sub-plugs 1Ps and 2Ps which vertically pass through the source select line SSL, the first dummy line DWL1, the first to nth word lines WL1 to WLn, the second dummy line DWL2, and the 11th and 12th drain select lines DSL11 and DSL12 may be separated by the channel isolation pattern cDP.

Therefore, in the cross-section taken along line C-C', the 11th or 12th drain select line DSL11 or DSL12 may be commonly coupled to the first and second sub-plugs 1Ps and 2Ps which are included in different main plugs and face each other in the Y direction, and the 11th and 12th drain select lines DSL11 and DSL12 may be coupled to the first and second sub-plugs 1Ps and 2Ps included in the same main plug.

The first contacts 1CT may be formed on top of the first sub-plugs 1Ps, and the jth bit line BLj may be formed on top of the first contacts 1CT. Therefore, different first sub-plugs 1Ps may be commonly coupled to the jth bit line BLj through the first contacts 1CT. The first contact 1CT might not be coupled to top portions of the second sub-plugs 2Ps which are included in the same main plug. Therefore, the second sub-plugs 2Ps might not be coupled to the jth bit line BLj.

Figure 11B:
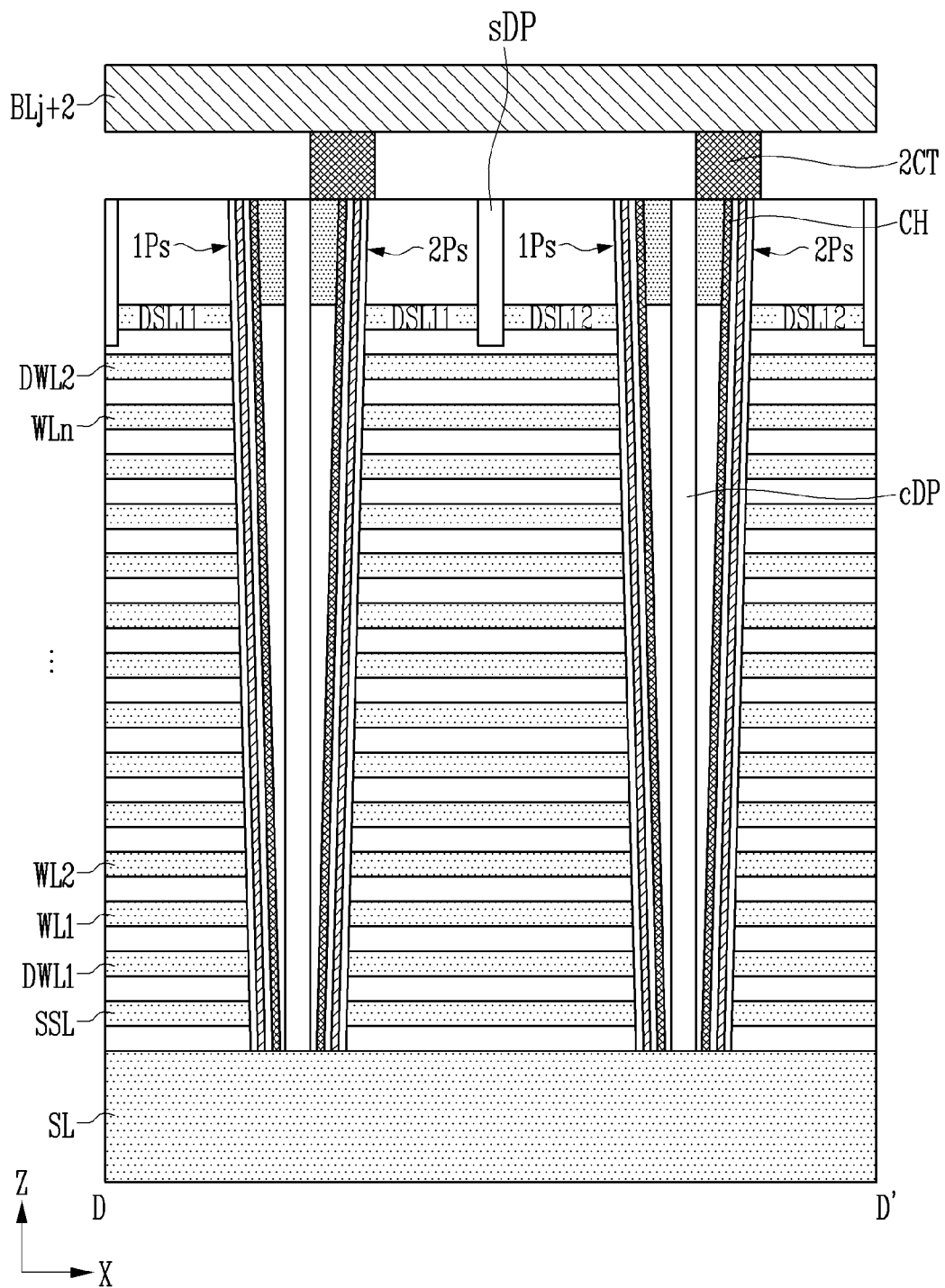
FIG. 11B is a cross-sectional diagram illustrating the structure of a memory block taken along line D-D' of FIG. 9.

FIG. 11B is a cross-sectional diagram illustrating the structure of a memory block taken along line D-D' of FIG. 9.

Referring to FIG. 11B, the second contacts 2CT may be formed on top of the second sub-plugs 2Ps, and the (j+2)th bit line BLj+2 may be formed on top of the second contacts 2CT. In the main plug where the second sub-plugs 2Ps are coupled to the (j+2)th bit line BLj+2, the first sub-plugs 1Ps might not be coupled to the (j+2)th bit line BLj+2.

Since the 11th and 12th drain select lines DSL11 and DSL12 are spaced apart from each other by the selected isolation pattern sDP, these drain select lines may be electrically coupled to each other in a region where the selected isolation pattern sDP is not formed. For example, even when the first and second sub-plugs 1Ps and 2Ps which are formed between the selected isolation patterns sDP pass through the 11th drain select line DSL11, the 11th drain select line DSL11 might not be separated by the first and second sub-plugs 1Ps and 2Ps. Therefore, the first sub-plug 1Ps and the second sub-plug 2Ps may be commonly coupled to the 11th drain select line DSL11.

Figure 12:
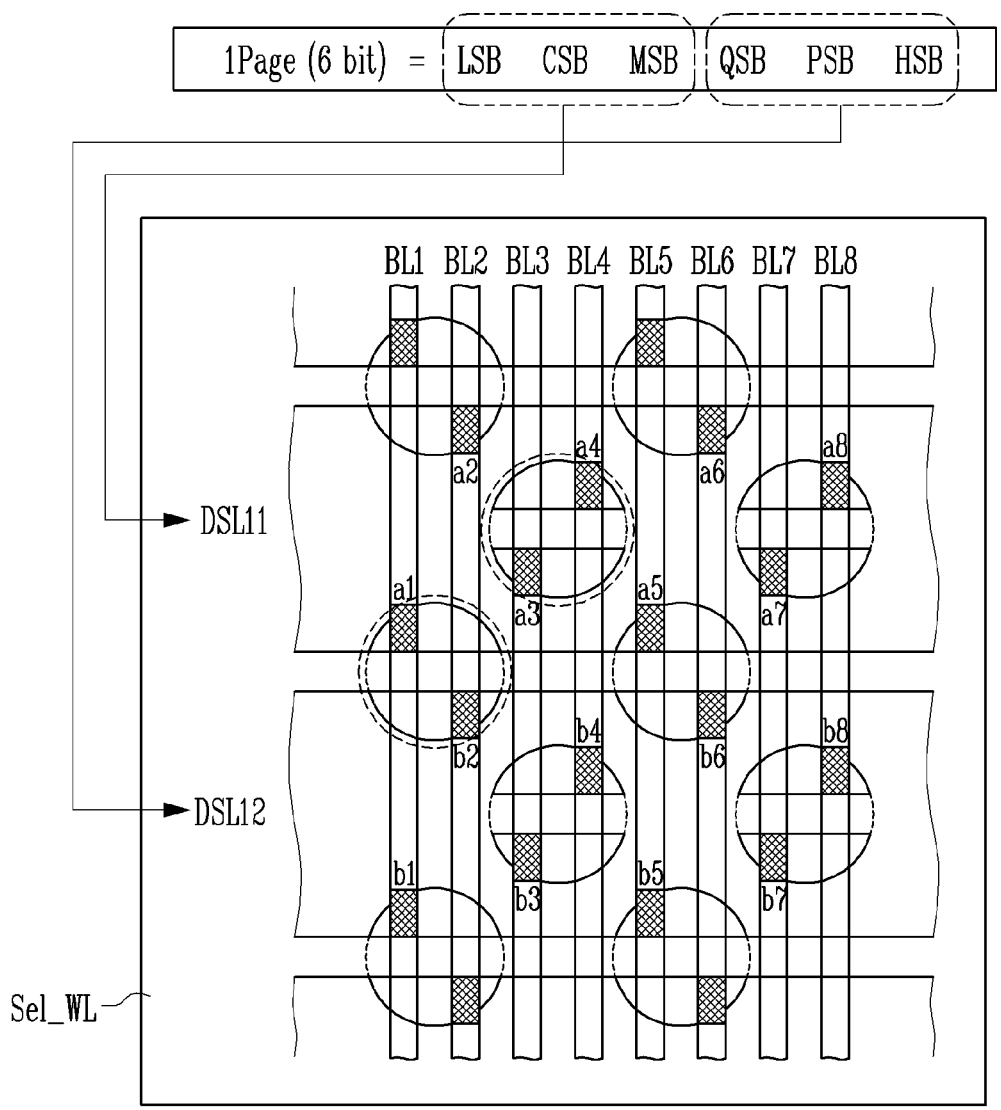
FIG. 12 is a view illustrating a method of operating a memory device according to a first embodiment of the present disclosure.

FIG. 12 is a view illustrating a method of operating a memory device according to a first embodiment of the present disclosure.

Referring to FIG. 12, when one page includes N bits (where N is a positive integer), a program operation for storing N bits of data in a single memory cell may be performed according to a general program scheme. A page may refer to a bit group of data stored in a single memory cell. In a program operation where two or more bits of data are stored in a single memory cell, the number of threshold voltage distributions of memory cells may be $2\bigcirc N$. For example, in a program operation using a triple level cell (TLC) method in which three bits of data are stored in a single memory cell, the number of threshold voltage distribution of memory cells may be $2\bigcirc 3$, i.e., 8. More specifically, threshold voltage distributions may be divided into one erase state and seven program states. In another example, in a program method of storing six bits of data in a single memory cell, the number of threshold voltage distributions of memory cells may be $2\bigcirc 6$, i.e., 64. More specifically, threshold voltage distributions may be divided into one erase state and 63 program states.

As described, when the number of bits stored in a single memory cell increases, an increase rate of the number of threshold voltage distributions may be greater than an increase rate of the number of bits. As a result, the number of program pulses used in the program operation may be increased, and the time for the program operation may be increased. In other words, the time taken to complete the program operation may be increased.

Therefore, according to the first embodiment, since a main plug is separated into a first sub-plug and a second sub-plug, one memory cell may be separated into two memory cells and a drain select line may also be separated. Therefore, in an embodiment, the time taken to program data with the same capacity may be reduced by controlling the separated drain select lines. In addition, in an embodiment, the number of read voltages used in a read operation may also be reduced since the read operation is performed in the same manner as the program operation is performed. Therefore, in an embodiment, the time taken to complete the read operation may also be reduced. The operating method according to the first embodiment will be described below.

It may be assumed that data of one page transferred by the host is six bits of data. The data of the one page may correspond to the first data DATA1 as described above with reference to FIG. 1. The six bits of data may be divided into LSB, CSB, MSB, QSB, PSB and HSB logical page data. Each of the LSB, CSB, MSB, QSB, PSB and HSB logical page data may include M bits of data (where M is a positive integer). A program operation may be performed by a combination of one bit of data in each of the LSB, CSB, MSB, QSB, PSB and HSB logical page data. For example, one bit of the LSB data, one bit of the CSB data, one bit of the MSB data, one bit of the QSB data, one bit of the PSB data, and one bit of the HSB data may be combined, and the combined data may be programmed into a single memory cell.

In a comparative program operation, the time for the program operation may be increased because six bits of data corresponding to the combination of the LSB, CSB, MSB, QSB, PSB, and HSB data may be programmed into memory cells selected by a first drain selected word line DSL1, among memory cells included in the selected word line, by a one-shot program method. According to the one-shot program method, all bits of data to be programmed may be combined, and each of the memory cells may be programmed according to a target state using a combined code.

However, according to the present disclosure, the first drain select line DSL1 may be separated into the 11th and 12th drain select lines DSL11 and DSL12, and the main plug may be separated into the first and second sub-plugs, so that data corresponding to half (½) of the six bits of data may be programmed into the memory cells coupled to the 11th drain select line DSL11, and data corresponding to the remaining half of the data may be programmed into the memory cells coupled to the 12th drain select line DSL12. For example, the first drain select line address ADD_dsl1 as shown in FIG. 1 may be allocated to the first drain select line DSL1, an 11th drain select line address (ADD_dsl11 in FIG. 1) may be allocated to the 11th drain select line DSL11, and a 12th drain select line address (ADD_dsl12 in FIG. 1) may be allocated to the 12th drain select line DSL12. Data groups corresponding to the half of the six bits of data may correspond to a (1-1)th data group DATA1_1 and a (1-2)th data group DATA1-2 as described above with reference to FIG. 1.

When a program operation starts, a voltage which is applied to the first to eighth bit lines BL1 to BL8 may be adjusted according to data where LSB, CSB, and MSB bits are combined. When a turn-on voltage is applied to the 11th drain select line DSL11 and a program voltage is applied to a selected word line Sel_WL, memory cells a1 to a8 selected by the 11th drain select line DSL11 may be programmed with LSB, CSB, and MSB data. A pass voltage may be applied to unselected word lines. Subsequently, the voltage which is applied to the first to eighth bit lines BL1 to BL8 may be adjusted according to data in which QSB, PSB, and HSB data are combined. When the turn-on voltage is applied to the 12th drain select line DSL12 and the program voltage is applied to the selected word line Sel_WL, memory cells b1 to b8 selected by the 12th drain select line DSL12 may be programmed with the QSB, PSB, and HSB data. The pass voltage may be applied to the unselected word lines.

In other words, the three bits of data which consist of LSB, CSB, and MSB may be programmed into the memory cells coupled to the 11th drain select line DSL11 by the TLC method, and the three bits of data which consist of QSB, PSB, and HSB may be programmed into the memory cells coupled to the 12th drain select line DSL12 by the TLC method. Therefore, in an embodiment, a program operation time may be reduced compared to a method of programming six bits of data at the same time.

Figure 13:
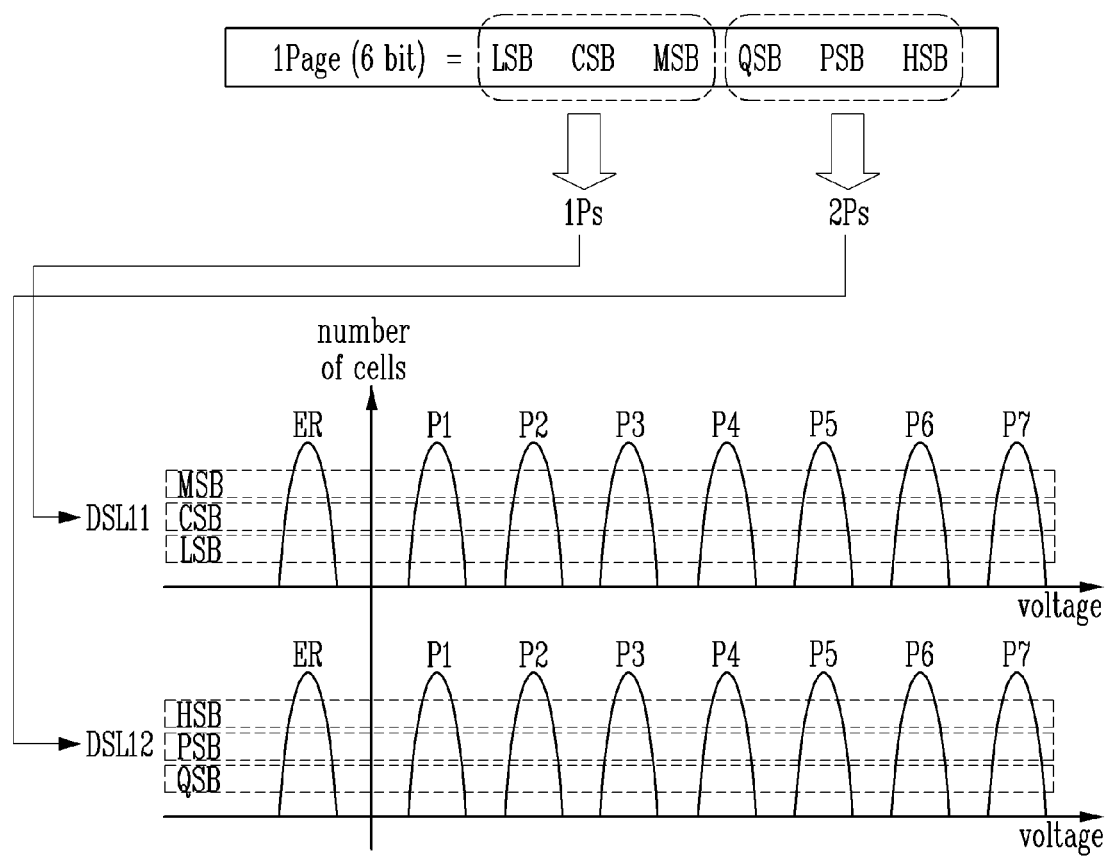
FIG. 13 is a diagram illustrating threshold voltages of programmed memory cells according to a first embodiment of the present disclosure.

FIG. 13 is a diagram illustrating threshold voltages of programmed memory cells according to a first embodiment of the present disclosure.

Referring to FIG. 13, when one page includes six bits of data including LSB, CSB, MSB, QSB, PSB, and HSB, half (½) of the 6-bit data may be programmed into the memory cells included in the first sub-plugs 1Ps, and the remaining half of the data may be programmed into the memory cells included in the second sub-plugs 2Ps. It may be assumed that the first sub-plugs 1Ps are selected by the 11th drain select line DSL11 and the second sub-plugs 2Ps are selected by the 12th drain select line DSL12. The memory cells included in the first sub-plugs 1Ps may be programmed with LSB, CSB, and MSB data. When a program operation of the memory cells included in the first sub-plugs 1Ps is completed, the memory cells included in the second sub-plugs 2Ps may be programmed with QSB, PSB and HSB data.

During a read operation, memory cells selected by the 11th drain select line DSL11 may be read by the TLC method, and memory cells selected by the 12th drain select line DSL12 may be read by the TLC method.

Figure 14:
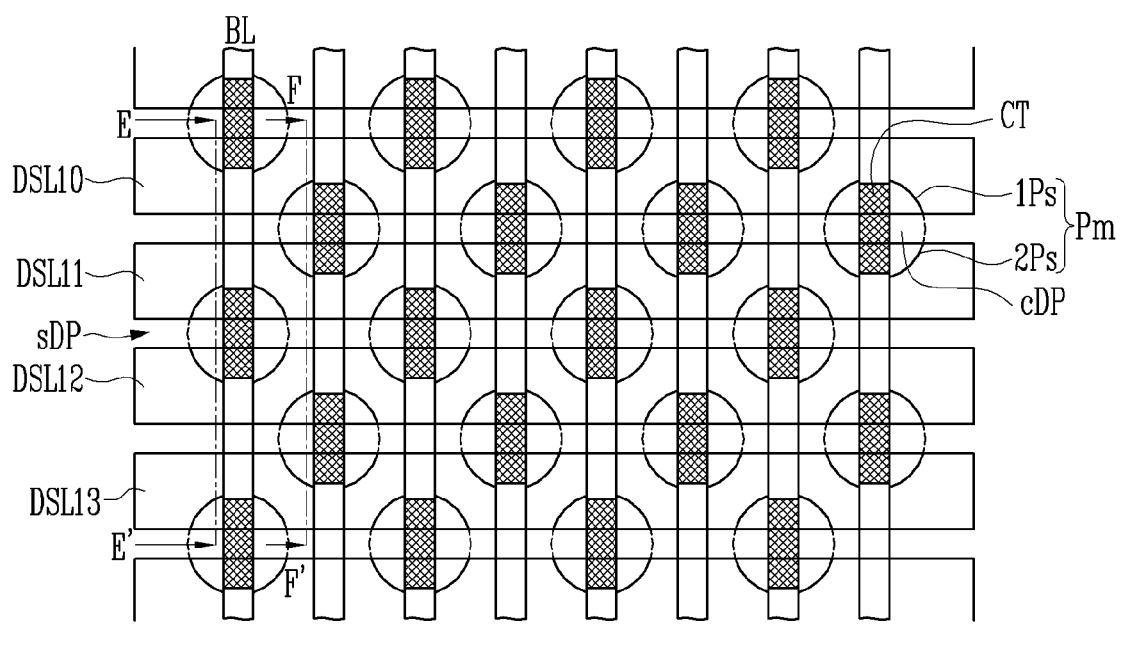
FIG. 14 is a plan view illustrating the structure of a memory block according to a second embodiment of the present disclosure.

FIG. 14 is a plan view illustrating the structure of a memory block according to a second embodiment of the present disclosure.

Referring to FIG. 14, the main plug Pm may include the first and second sub-plugs 1Ps and 2Ps which are spaced apart from each other by the channel isolation pattern cDP. A drain select line may be commonly coupled to sub-plugs which are arranged in a zigzag pattern along the X direction, and may be separated from each other in the Y direction. For example, the 10th, 11th, 12th, and 13th drain select lines DSL10, DSL11, DSL12, and DSL13 may be spaced apart from each other by the selected isolation patterns sDP which extend in the X direction. The channel isolation patterns cDP may be formed at overlapping areas between the selected isolation patterns sDP and the main plugs Pm.

The bit lines BL may extend in the Y direction and be spaced apart from each other in the X direction. The first and second sub-plugs 1Ps and 2Ps which are arranged in the same direction (Y direction) as the bit line BL may be commonly coupled to the same bit line BL. The first or second sub-plugs 1Ps or 2Ps which are arranged in the X direction may be coupled to different bit lines BL. The first and second sub-plugs 1Ps and 2Ps included in the same main plug Pm may be commonly coupled to the bit line BL through the same contact CT so that the first and second sub-plugs 1Ps and 2Ps included in the same main plug Pm may be electrically coupled to the same bit line BL.

Figure 15:
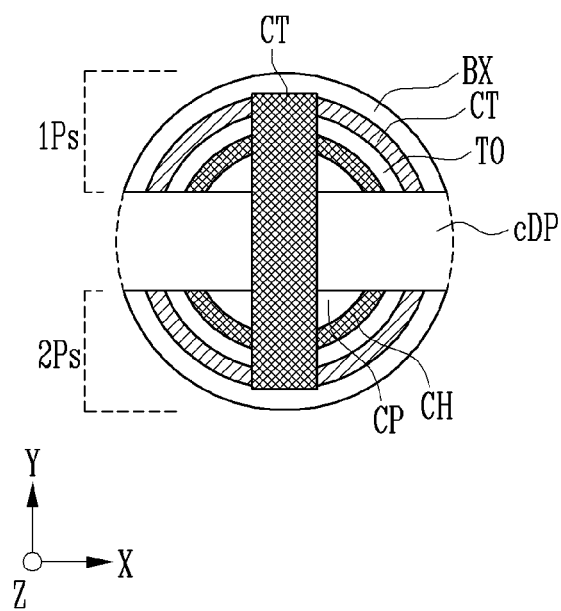
FIG. 15 is a plan view illustrating the structure of sub-plugs shown in FIG. 14.

FIG. 15 is a plan view illustrating the structure of sub-plugs shown in FIG. 14.

Referring to FIG. 15, the contact CT may commonly contact the first and second sub-plugs 1Ps and 2Ps. For example, the contact CT may be commonly coupled to the channel layer CH included in the first sub-plug 1Ps and the channel layer CH included in the second sub-plug 2Ps.

Figure 16A:
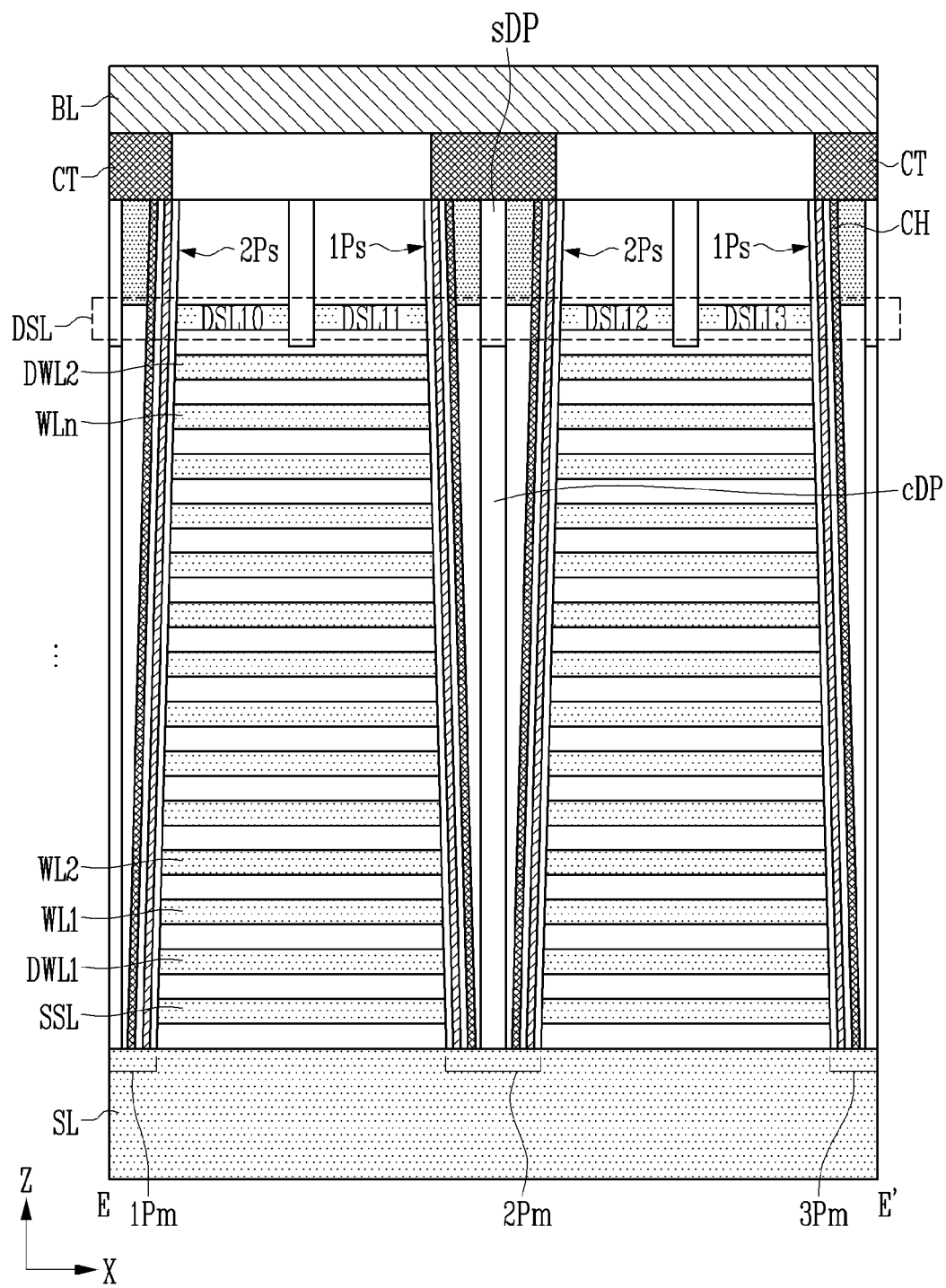
FIG. 16A is a cross-sectional diagram illustrating the structure of a memory block taken along line E-E' of FIG. 14.

FIG. 16A is a cross-sectional diagram illustrating the structure of a memory block taken along line E-E' of FIG. 14.

Referring to FIG. 16A, the selected isolation patterns sDP may be formed in areas where main plugs are formed, and between the main plugs. Therefore, the drain select line DSL formed on the same layer may be separated into the 10th, 11th, 12th, and 13th drain select lines DSL10, DSL11, DSL12, and DSL13 by the selected isolation patterns sDP. When first to third main plugs 1Pm to 3Pm are spaced apart from each other in the X direction, the second sub-plug 2Ps included in the first main plug 1Pm may be coupled to the 10th drain select line DSL10. The first sub-plug 1Ps included in the second main plug 2Pm may be coupled to the 11th drain select line DSL11. The second sub-plug 2Ps may be coupled to the 12th drain select line DSL12. The first sub-plug 1Ps included in the third main plug 3Pm may be coupled to the 13th drain select line DSL13. The first and second sub-plugs 1Ps and 2Ps included in each of the first to third main plugs 1Pm to 3Pm may be separated from each other by the channel isolation pattern cDP. However, each of the contacts CT may be formed on the first and second sub-plugs 1Ps and 2Ps included in the same main plug. The bit line BL may be formed on top of the contacts CT. Therefore, the bit line BL which extends in the Y direction may be commonly coupled to the first and second sub-plugs 1Ps and 2Ps included in each of the first to third main plugs 1Pm to 3Pm.

Figure 16B:
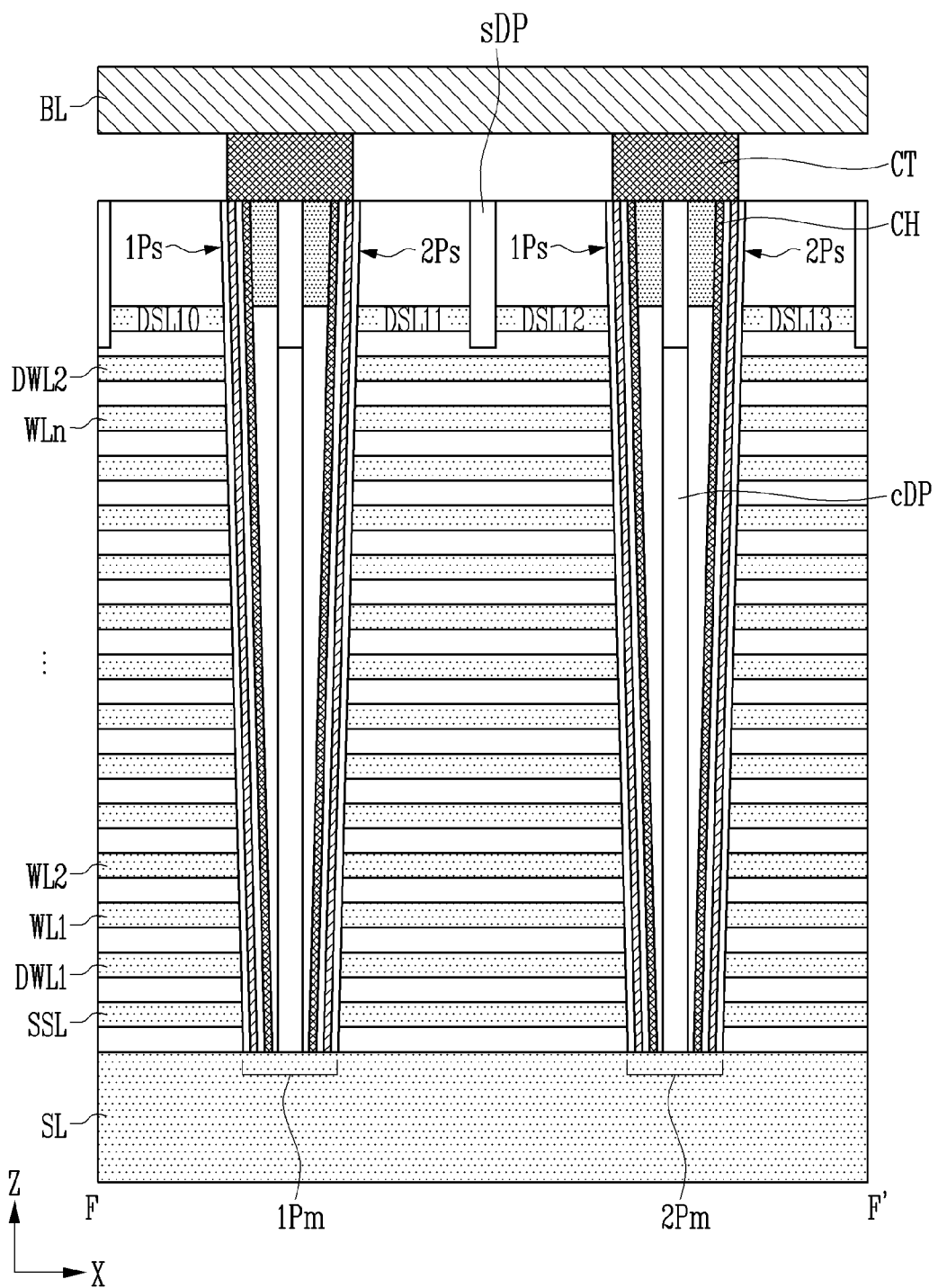
FIG. 16B is a cross-sectional diagram illustrating the structure of a memory block taken along line F-F' of FIG. 14.

FIG. 16B is a cross-sectional diagram illustrating the structure of a memory block taken along line F-F' of FIG. 14.

Referring to FIG. 16B, the first main plug 1Pm may be formed between the 10th and 11th drain select lines DSL10 and DSL11, and the second main plug 2Pm may be formed between the 12th and 13th drain select lines DSL12 and DSL13. For example, the first sub-plug 1Ps included in the first main plug 1Pm may contact the 10th drain select line DSL10, and the second sub-plug 2Ps may contact the 11th drain select line DSL11. The first sub-plug 1Ps included in the second main plug 2Pm may be coupled to the 12th drain select line DSL12. The second sub-plug 2Ps may be coupled to the 13th drain select line DSL13. Each of the source select line SSL, the first dummy line DWL1, the first to nth word lines WL1 to WLn, and the second dummy line DWL2 may be commonly coupled to the first and second main plugs 1Pm and 2Pm.

Each of the contacts CT may be formed on top of the first and second sub-plugs 1Ps and 2Ps included in each of the first and second main plugs 1Pm and 2Pm. The bit line BL may be formed on top of the contacts CT. Therefore, the bit line BL extending in the Y direction may be commonly coupled to the first and second sub-plugs 1Ps and 2Ps included in each of the first and second main plugs 1Pm and 2Pm.

Figure 17:
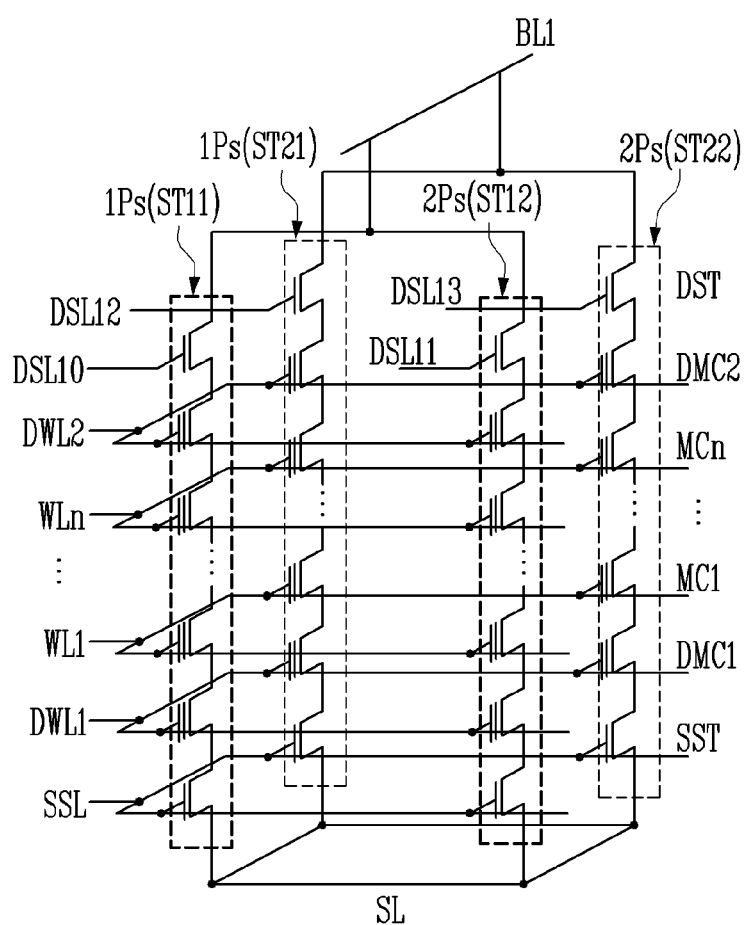
FIG. 17 is a circuit diagram illustrating a memory block shown in FIG. 14.

FIG. 17 is a circuit diagram illustrating a memory block shown in FIG. 14.

Referring to FIG. 17, 11th to 22nd strings ST11 to ST22 may be commonly coupled to the first bit line BL1.

The 11th and 12th strings ST11 and ST12 may be included in one main plug. The 21st and 22nd strings ST21 and ST22 may be included in one main plug. For example, the 11th string ST11 may correspond to the first sub-plug 1Ps included in the first main plug, and the 12th string ST12 may correspond to the second sub-plug 2Ps included in the first main plug. The 21st string ST21 may correspond to the first sub-plug 1Ps included in the second main plug, and the 22nd string ST22 may correspond to the second sub-plug 2Ps included in the second main plug.

The drain select transistor DST included in the 11th string ST11 may be coupled to the 10th drain select line DSL10. The drain select transistor DST included in the 12th string ST12 may be coupled to the 11th drain select line DSL11. The drain select transistor DST included in the 21st string ST21 may be coupled to a 12th drain select line DSL12. The drain select transistor DST included in the 22nd string ST22 may be coupled to a 13th drain select line DSL13.

Therefore, during a program or read operation, when the 10th drain select line DSL10 is selected and the remaining 11th to 13th drain select lines DSL11 to DSL13 are not selected, the 11th string ST11 may be selected and the remaining 12th to 22nd strings ST12 to ST22 might not be selected. For example, it may be assumed that the first word line WL1 is a selected word line, a turn-on voltage is applied to the 10th drain select line DSL10, and a turn-off voltage is applied to the 11th to 13th drain select lines DSL11 to DSL13. When a program voltage is applied to the first word line WL1, the first memory cell MC1 included in the 11th string ST11, among the first memory cells MC1 coupled to the first word line WL1, may be programmed according to the voltage applied to the first bit line BL1. In other words, with respect to memory cells coupled to the same word line, selected memory cells may be changed by a selected drain select line. A method of operating the memory device having the above-described structure is described below.

Figure 18:
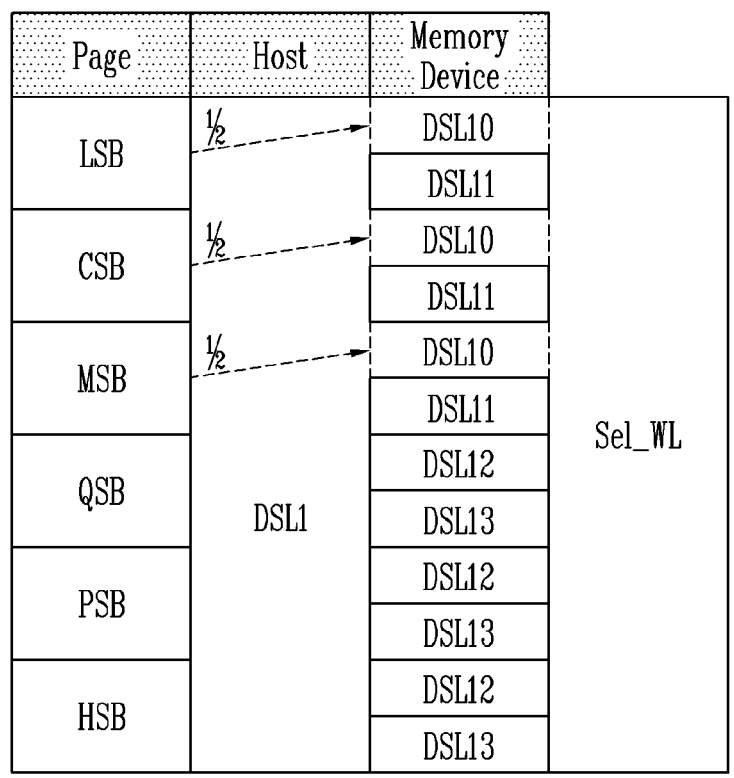
FIG. 18 is a diagram illustrating a method of operating a memory device according to a second embodiment of the present disclosure.

FIG. 18 is a plan view illustrating a method of operating a memory device according to a second embodiment of the present disclosure.

Referring to FIG. 18, according to the second embodiment, one memory cell may be separated into a first sub-plug and a second sub-plug, and a drain select line may be separated. By controlling the separated sub-plugs and the separated drain select lines, in an embodiment, the time taken to program data with the same capacity may be reduced, and the time to perform a read operation may be reduced. The operating method according to the second embodiment will be described below in more detail.

It may be assumed that data of one (1) page transferred by a host is six bits of data. The 6-bit data may be divided into the LSB, CSB, MSB, QSB, PSB and HSB data. For example, the LSB data may be one bit, the CSB data may be one bit, the MSB data may be one bit, the QSB data may be one bit, the PBS data may be one bit, and the HSB data may be one bit.

In a comparative program operation, a program operation time may be increased because the six bits of data may be programmed into memory cells selected by the first drain selected word line DSL1, among memory cells included in the selected word line, by a one-shot program method. According to the one-shot program method, all bits of data to be programmed may be combined, and each of the memory cells may be programmed according to a target state using a combined code.

According to the second embodiment of the present disclosure, the first drain select line DSL1 may be the 10th, 11th, 12th, and 13th drain select lines DSL10, DSL11, DSL12, and DSL13, and the main plug may be separated into the first and second sub-plugs. Memory cells selected by a drain select line may be programmed with data obtained by dividing N bits of data in half (½) (where N is a positive integer) and dividing logical page data included in each divided group in half. For example, it may be assumed that page data includes six bits and logical page data included in the six bits of data are LSB, CSB, MSB, QSB, PSB and HSB data. In other words, each of the LSB, CSB, MSB, QSB, PSB and HSB data may be the logical page data including M bits (where M is a positive integer). The LSB, CSB, MSB, QSB, PSB and HSB data may be divided into 'LSB, CSB, MSB' and 'QSB, PSB, HSB'. A data combination obtained by dividing the logical page data of each of 'LSB, CSB, MSB' in half may be programmed into the selected memory cells.

During a program operation, when it is assumed that the 10th, 11th, 12th, and 13th drain select lines DSL10, DSL11, DSL12, and DSL13 are sequentially selected, a data combination of half of each of the LSB, CSB, and MSB data may be programmed into memory cells selected by the 10th drain select lines DSL10, and a data combination of the remaining half of each of the LSB, CSB, and MSB data may be programmed into memory cells selected by the 11th drain select lines DSL11. Subsequently, a data combination of half of each of the QSB, PSB and HSB may be programmed into memory cells selected by the 12th drain select line DSL12. A data combination of the remaining half of each of the QSB, PSB and HSB may be programmed into memory cells selected by the 13th drain select line DSL13.

In other words, the memory cells coupled to the 10th drain select line DSL10 may be programmed with three bits of data including LSB, CSB, and MSB corresponding to the half of the entirety of the LSB, CSB, and MSB data by a TLC method. Three bits of data including LSB, CSB, and MSB corresponding to the remaining half of the entirety of the LSB, CSB, and MSB data may be programmed into memory cells coupled to the 11th drain select line DSL11 by the TLC method. The memory cells coupled to the 12th drain select line DSL12 may be programmed with three bits of data including QSB, PSB, and HSB corresponding to the half of the entirety of the QSB, PSB, and HSB data by the TLC method. The other three bits of data including QSB, PSB, and HSB corresponding to the remaining half of the entirety of the QSB, PSB, and HSB data may be programmed into memory cells coupled to the 13th drain select line DSL13 by the TLC method.

As described above, in an embodiment, by performing a program operation by dividing the entire data, the time to perform the program operation may be reduced as compared with a method of programming the entire page data at the same time. The above-described program operation will be described below.

Figure 19:
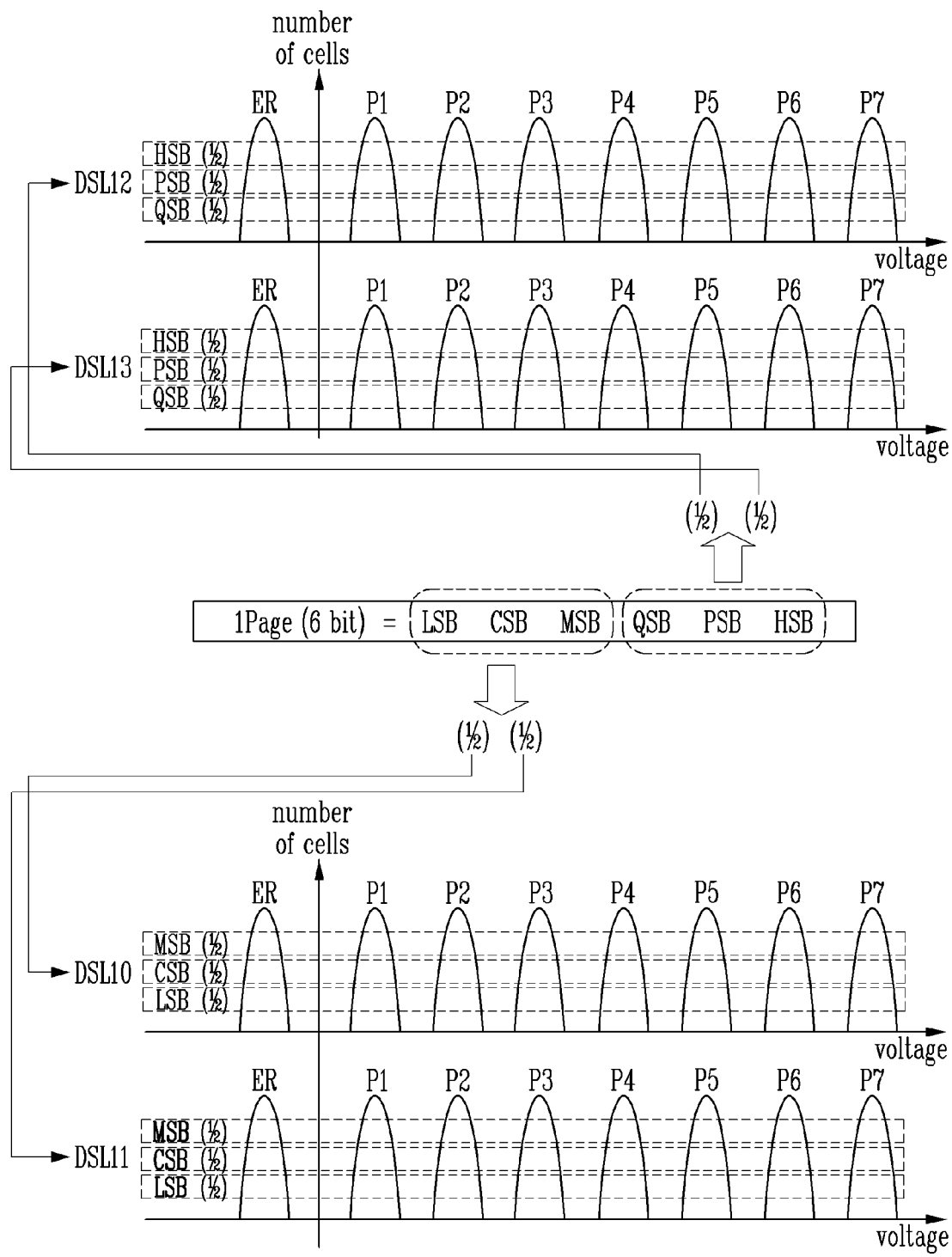
FIG. 19 is a diagram illustrating threshold voltages of programmed memory cells according to a second embodiment of the present disclosure.

FIG. 19 is a diagram illustrating threshold voltages of programmed memory cells according to a second embodiment of the present disclosure.

Referring to FIG. 19, when one page includes six bits of data including LSB, CSB, MSB, QSB, PSB and HSB data, the LSB, CSB, and MSB data corresponding to half (½) of the six-bit data may be programmed into memory cells selected by the 10th or 11th drain select line DSL10 or DSL11, and the QSB, PSB, and HSB data corresponding to the remaining half of the data may be programmed into memory cells selected by the 12th or 13th drain select line DSL12 or DSL13.

For example, a data combination corresponding to half of the LSB, CSB, and MSB data may correspond to the (1-1)th data group DATA1-1 as shown FIG. 1, and the (1-1)th data group DATA1-1 may be programmed into the memory cells selected by the 10th drain select line DSL10. For example, a data combination corresponding to the other half of the LSB, CSB, and MSB data may correspond to the (1-2)th data group DATA1-2 as shown FIG. 1, and the (1-2)th data group DATA1-2 may be programmed into the memory cells selected by the 11th drain select line DSL11. In this manner, a data combination corresponding to half of the QSB, PSB and HSB data may be programmed into memory cells selected by the 12th drain select line DSL12. In addition, a data combination corresponding to the remaining half of the QSB, PSB and HSB data may be programmed into memory cells selected by the 13th drain select line DSL13.

During a read operation, the memory cells selected by the 10th, 11th, 12th, and 13th drain select lines DSL10, DSL11, DSL12, and DSL13 may be read by a TLC method.

Figure 20:
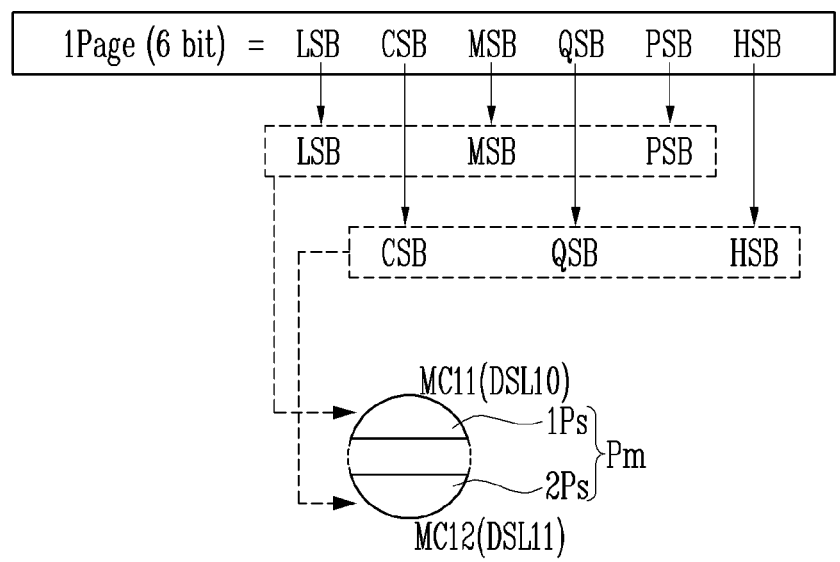
FIG. 20 is a diagram illustrating another embodiment for dividing logical page data.

FIG. 20 is a diagram illustrating another embodiment for dividing logical page data.

Referring to FIG. 20, in the above-described first and second embodiments, the LSB, CSB, MSB, QSB, PSB, and HSB logical page data may be divided into 'LSB, CSB, MSB' and 'QSB, PSB, HSB', which may then be programmed into selected memory cells. However, the logical page data may also be divided according to other various methods. For example, the LSB, CSB, MSB, QSB, PSB, and HSB logical page data may be divided into one data combination including LSB, MSB, and PSB data, and the other data combination including the CSB, QSB, and HSB data. During a program operation of the LSB, MSB, and PSB data combination, a turn-on voltage may be applied to the 10th drain select line DSL10 to select the first sub-plug 1Ps coupled to the 10th drain select line DSL10. A selected memory cell MC11, among the plurality of memory cells included in the first sub-plug 1Ps, may be programmed with the LSB, MSB, and PSB data. When the program operation of the LSB, MSB, and PSB data is completed, a program operation of programming the CSB, QSB, and HSB data combination may be performed. For example, a turn-off voltage may be applied to the 10th drain select line DSL10, and a turn-on voltage may be applied to the 11th drain select line DSL11 to select the second sub-plug 2Ps coupled to the 11th drain select line DSL11. A selected memory cell MC12, among the plurality of memory cells included in the second sub-plug 2Ps, may be programmed with the CSB, QSB, and HSB data.

Figure 21:
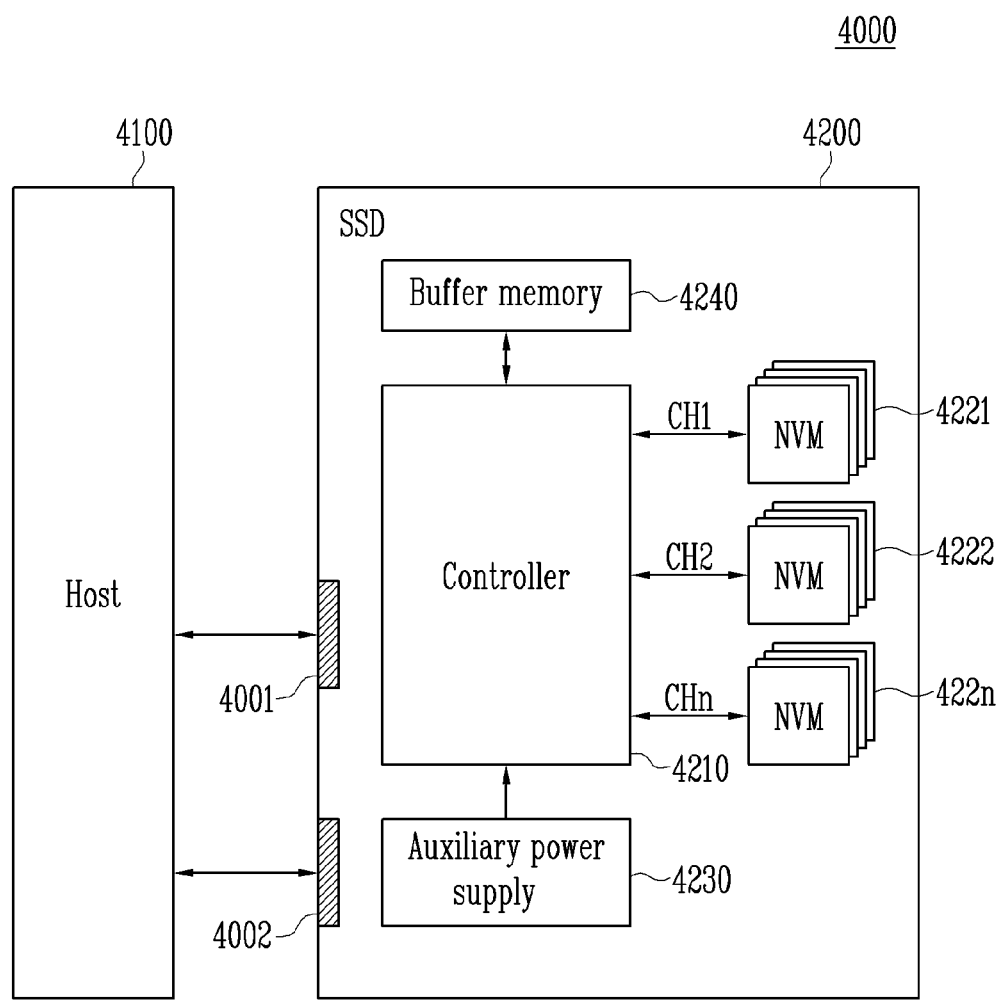
FIG. 21 is a diagram illustrating a solid state drive (SSD) system to which a memory device according to the present disclosure is applied.

FIG. 21 is a block diagram illustrating a solid state drive (SSD) system 4000 according to an embodiment of the present disclosure.

Referring to FIG. 21, the SSD system 4000 may include a host 4100 and an SSD 4200. The SSD 4200 may exchange signals with the host 4100 through a signal connector 4001 and may receive power through a power connector 4002. The SSD 4200 may include a controller 4210, a plurality of flash memories 4221 to 422n, an auxiliary power supply 4230, and a buffer memory 4240. In an embodiment, the memories 4221 to 422n may include non-volatile memory (NMV).

According to an embodiment, each of the plurality of flash memories 4221 to 422n may be configured in the same manner as the memory device 100 as described above with reference to FIG. 1 is configured.

The controller 4210 may control the plurality of flash memories 4221 to 422n in response to the signals received from the host 4100. In an embodiment, the signals may be based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied and charged with the power from the host 4100. The auxiliary power supply 4230 may supply the power of the SSD 4200 when the power is not smoothly supplied from the host 4100. In an embodiment, the auxiliary power supply 4230 may be positioned inside or outside the SSD 4200. For example, the auxiliary power supply 4230 may be disposed in a main board and supply auxiliary power to the SSD 4200.

The buffer memory 4240 may serve as a buffer memory of the SSD 4200. For example, the buffer memory 4240 may temporarily store data received from the host 4100 or data received from the plurality of flash memories 4221 to 422n, or may temporarily store metadata (e.g., mapping tables) of the flash memories 4221 to 422n. The buffer memory 4240 may include volatile memories such as DRAM, SDRAM, DDR SDRAM, LPDDR SDRAM, and GRAM, or nonvolatile memories such as FRAM, ReRAM, STT-MRAM, and PRAM.

Figure 22:
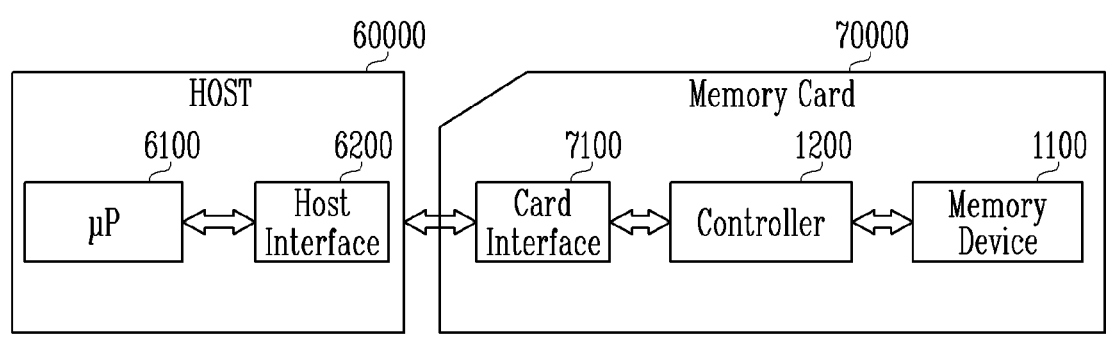
FIG. 22 is a diagram illustrating a memory card system to which a memory device according to the present disclosure is applied.

FIG. 22 is a diagram illustrating a memory system 70000 according to an embodiment of the present disclosure.

Referring to FIG. 22, the memory system 70000 may include a memory card or a smart card. The memory system 70000 may include a memory device 1100, a controller 1200, and a card interface 7100.

The memory device 1100 may be configured in the same manner as the memory device 100 as shown above in FIG. 2.

The controller 1200 may control data exchange between the memory device 1100 and the card interface 7100. According to an embodiment, the card interface 7100 may be, but is not limited thereto, a secure digital (SD) card interface or a multi-media card (MMC) interface.

The card interface 7100 may interface data exchange between a host 60000 and the controller 1200 according to a protocol of the host 60000. According to an embodiment, the card interface 7100 may support a Universal Serial Bus (USB) protocol and an InterChip (IC)-USB protocol. The card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 in response to control of a microprocessor 6100.

According to the present disclosure, in an embodiment, a degree of integration of a memory device may be improved, and an operating speed of the memory device may be improved.

It will be apparent to those skilled in the art that various modifications can be made to any of the above-described embodiments of the present disclosure without departing from the spirit or scope of the disclosure. Thus, it is intended that the present disclosure cover all such modifications provided they come within the scope of the appended claims and their equivalents.

What is claimed is:

1. A method of operating a memory device, the method comprising:
   receiving data output from a host;
   dividing the data into M bits of page data;
   dividing the M bits of the page data into first and second data groups each including M/2 bits of the page data, wherein M is a positive integer;
   programming the first data group into first memory cells coupled to a selected word line; and
   programming the second data group into second memory cells coupled to the selected word line.

2. The method of claim 1, wherein the programming of the first or second data group into the first or second memory cells is performed by programming the M/2 bits of the page data into one memory cell.

3. The method of claim 1, wherein the programming of the first data group into the first memory cells coupled to the selected word line comprises:
   applying a turn-on voltage to a select line corresponding to the first memory cells;
   controlling a voltage of bit lines according to data of the first data group including the M/2 bits of the page data; and
   applying a program voltage to the selected word line.

4. The method of claim 1, wherein the programming of the second data group into the second memory cells coupled to the selected word line comprises:
   applying a turn-on voltage to a select line corresponding to the second memory cells;
   controlling a voltage of bit lines according to data of the second data group including the M/2 bits of the page data; and
   applying a program voltage to the selected word line.

5. The method of claim 1, wherein during an operation of reading the M bits of the page data, a read operation of the first memory cells and a read operation of the second memory cells are performed separately.

6. The method of claim 5, wherein the read operation of one of the first and second memory cells is performed by reading the M/2 bits of the page data.

7. A method of operating a memory device, the method comprising:
   receiving data output from a host;
   dividing the data into M bits of page data;
   dividing the M bits of the page data into first and second data groups, wherein M is a positive integer;
   dividing logical page data included in the first data group into first and second logical page data groups;
   dividing logical page data included in the second data group into third and fourth logical page data groups;
   programming the first logical page data group into first memory cells selected by a first select line;
   programming the second logical page data group into second memory cells selected by a second select line forming a pair with the first select line;
   programming the third logical page data group into third memory cells selected by a third select line; and
   programming the fourth logical page data group into fourth memory cells selected by a fourth select line forming a pair with the third select line.

8. The method of claim 7, wherein the programming of the first to fourth logical page data groups to the first to fourth memory cells is performed by programming M/2 bits of the page data into one memory cell.

9. The method of claim 7, wherein first sub-strings in which the first memory cells are included and second sub-strings in which the second memory cells are included share bit lines,
   wherein the second sub-strings are not selected when the first sub-strings are selected by a turn-on voltage applied to the first select line, and
   wherein the first sub-strings are not selected when the second sub-strings are selected by the turn-on voltage applied to the second select line.

10. The method of claim 7, wherein third sub-strings in which the third memory cells are included and fourth sub-strings in which the fourth memory cells are included share bit lines,
   wherein the fourth sub-strings are not selected when the third sub-strings are selected by a turn-on voltage applied to the third select line, and
   wherein the third sub-strings are not selected when the fourth sub-strings are selected by the turn-on voltage applied to the fourth select line.

* * * * *